(12) United States Patent
Ochimizu et al.

(10) Patent No.: US 8,916,468 B2
(45) Date of Patent: Dec. 23, 2014

(54) SEMICONDUCTOR DEVICE FABRICATION METHOD

(71) Applicant: Fujitsu Semiconductor Limited, Yokohama-shi, Kanagawa (JP)

(72) Inventors: Hirosato Ochimizu, Kuwana (JP); Atsuhiro Tsukune, Inagi (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/911,746

(22) Filed: Jun. 6, 2013

(65) Prior Publication Data

US 2013/0273701 A1 Oct. 17, 2013

Related U.S. Application Data

(63) Continuation of application No. PCT/JP2010/073684, filed on Dec. 28, 2010.

(51) Int. Cl.
*H01L 21/4763* (2006.01)
*H01L 21/768* (2006.01)
*H01L 23/48* (2006.01)
*H01L 23/485* (2006.01)
*H01L 23/522* (2006.01)
*H01L 25/065* (2006.01)

(52) U.S. Cl.
CPC ........ *H01L 21/76898* (2013.01); *H01L 23/481* (2013.01); *H01L 23/485* (2013.01); *H01L 23/522* (2013.01); *H01L 25/0657* (2013.01); *H01L 21/76802* (2013.01); *H01L 21/76807* (2013.01); *H01L 21/76816* (2013.01); *H01L 21/76846* (2013.01); *H01L 21/76849* (2013.01); *H01L 21/76877* (2013.01); *H01L 2225/06513* (2013.01); *H01L 2225/06541* (2013.01); *H01L 2224/0382* (2013.01); *H01L 2224/0401* (2013.01); *H01L 2224/0557* (2013.01); *H01L 2224/06181* (2013.01); *H01L 2224/16145* (2013.01); *H01L 2224/11009* (2013.01); *H01L 2225/06565* (2013.01); *H01L 2225/06544* (2013.01); *H01L 2224/05572* (2013.01)
USPC ............... 438/637; 438/197; 257/E21.585

(58) Field of Classification Search
USPC ........................... 438/209; 257/E21.4
See application file for complete search history.

(56) References Cited

U.S. PATENT DOCUMENTS 7,994,641 B2   8/2011   Inohara
2009/0008747 A1   1/2009   Hoshino et al.
(Continued)

FOREIGN PATENT DOCUMENTS

EP   2194574 A2   6/2010
JP   2001-345324 A   12/2001
(Continued)

OTHER PUBLICATIONS

International Search Report of PCT/JP2010/073684, mailing date of Mar. 1, 2011.
(Continued)

*Primary Examiner* — Cheung Lee
(74) *Attorney, Agent, or Firm* — Westerman, Hattori, Daniels & Adrian, LLP

(57) ABSTRACT

A transistor formed on a semiconductor substrate is covered with a first insulating film, and first conductive vias which pierce the first insulating film and which reach the transistor and a second conductive via which pierces the first insulating film and which reaches an inside of the semiconductor substrate are formed. After the formation of the first conductive vias and the second conductive via, a second insulating film is formed over the first insulating film. Conducive portions connected to the first conductive vias leading to the transistor and a conductive portion connected to the second conductive via which reaches the inside of the semiconductor substrate are formed in the second insulating film. By doing so, a multilayer interconnection is formed.

19 Claims, 26 Drawing Sheets

(56) References Cited

U.S. PATENT DOCUMENTS

| | | | |
|---|---|---|---|
| 2009/0057844 A1 | 3/2009 | Tanida et al. | |
| 2009/0152602 A1 | 6/2009 | Akiyama | |
| 2009/0321796 A1* | 12/2009 | Inohara | 257/288 |
| 2010/0133660 A1 | 6/2010 | Huyghebaert et al. | |

FOREIGN PATENT DOCUMENTS

| | | |
|---|---|---|
| JP | 2009-016773 A | 1/2009 |
| JP | 2009-064820 A | 3/2009 |
| JP | 2009-147218 A | 7/2009 |
| JP | 2010-010324 A | 1/2010 |
| JP | 2010-114352 A | 5/2010 |
| JP | 2010-153848 A | 7/2010 |
| JP | 2010-245263 A | 10/2010 |

OTHER PUBLICATIONS

Japanese Office Action dated Apr. 1, 2014, issued in corresponding Japanese application No. 2012-550619, w/ partial English translation (7 pages).

* cited by examiner

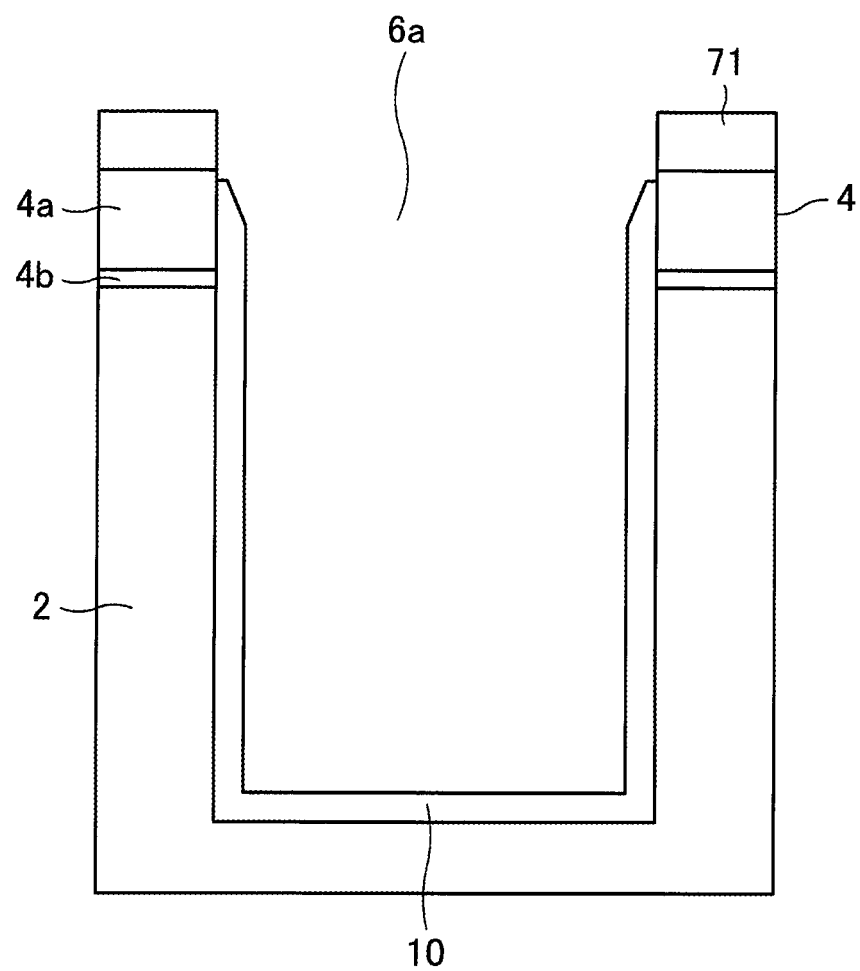

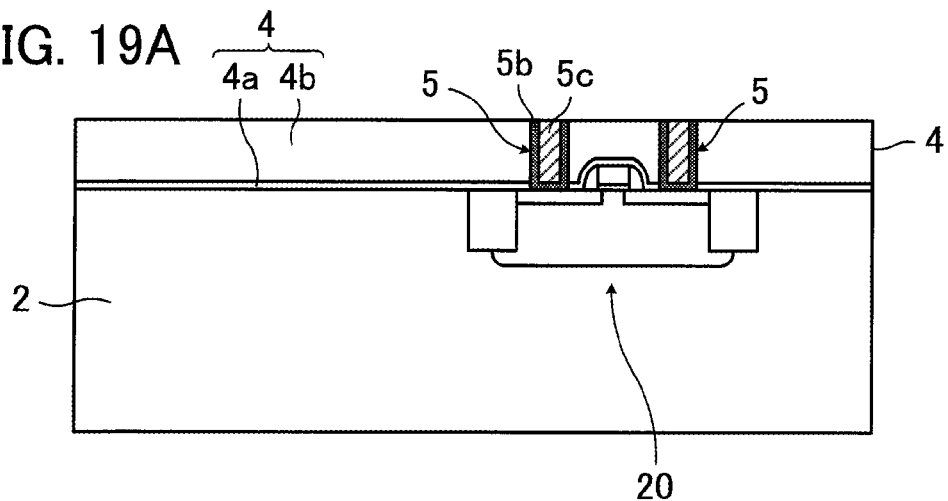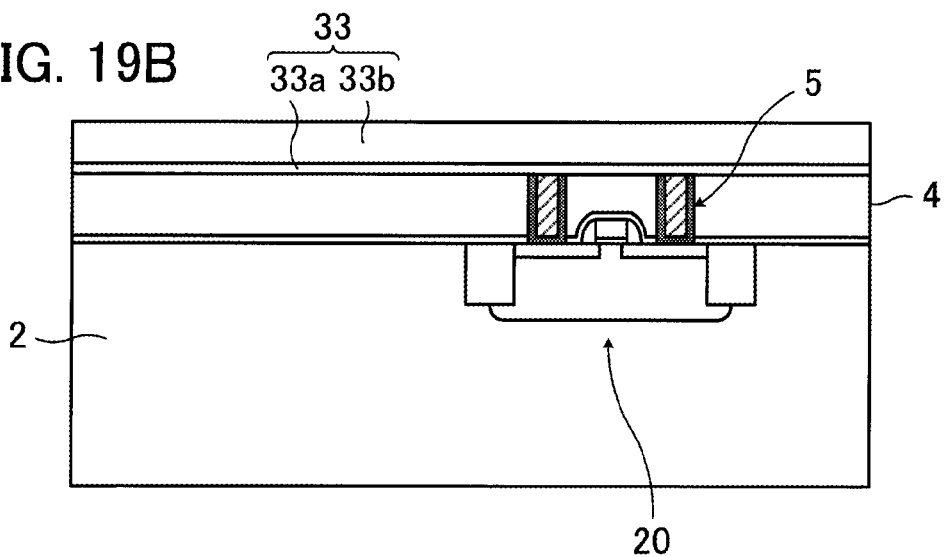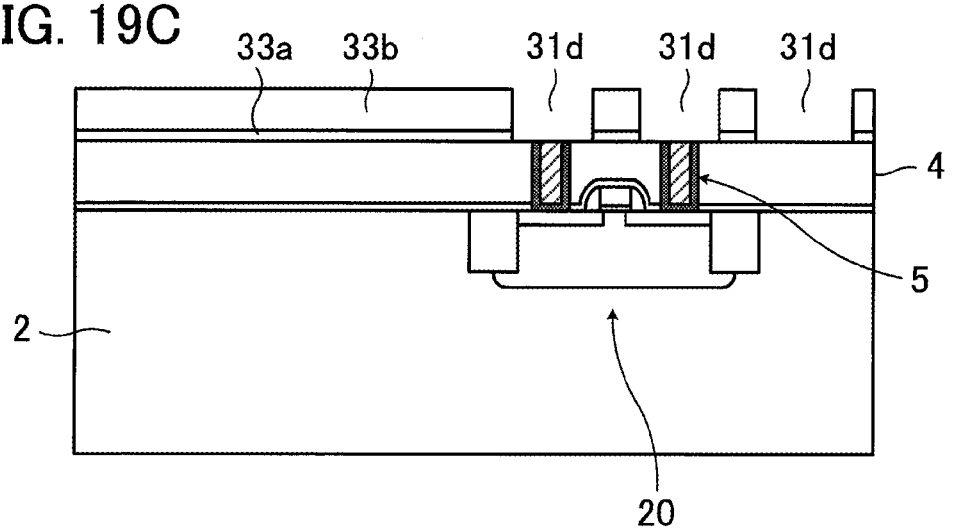

SEMICONDUCTOR DEVICE FABRICATION METHOD

CROSS-REFERENCE TO RELATED APPLICATION

This application is a continuation application of International Application PCT/JP2010/073684 filed on Dec. 28, 2010 which designated the U.S., the entire contents of which are incorporated herein by reference.

FIELD

The embodiments discussed herein are related to a semiconductor device fabrication method.

BACKGROUND

A technique for forming a conductive via in a semiconductor substrate used in a semiconductor device and electrically connecting the upper and under sides of the semiconductor device by the use of the conductive via is known. For example, such a semiconductor device is used in plurality for fabricating an apparatus having a stacked structure in which they are stacked and in which they are electrically connected to one another. For example, the following method is known as a method for forming a conductive via in a semiconductor substrate. A wiring layer is formed on an upper side of a semiconductor substrate. After that, a via hole is made in the semiconductor substrate and the via hole is filled in with a conductive material.

Japanese Laid-open Patent Publication No. 2009-016773
Japanese Laid-open Patent Publication No. 2009-064820

When a semiconductor device in which conductive vias are formed in a semiconductor substrate is fabricated, the conductive vias are formed in the semiconductor substrate in addition to elements, such as transistors. As a result, a fabrication process may become complex. Furthermore, if the conductive vias are formed in the semiconductor substrate, for example, after the formation of a wiring layer, then it may be impossible from the viewpoint of a fabrication process to form the conductive vias with accuracy. Alternatively, there may be need for determining the arrangement of wirings and the like in the wiring layer with the arrangement of the conductive vias taken into consideration.

SUMMARY

According to an aspect, there is provided a semiconductor device fabrication method including forming a transistor with a source and a drain on a semiconductor substrate, forming a first insulating film over the transistor, forming, in the first insulating film, a first conductive via which reaches the source or the drain, forming an opening which pierces the first insulating film and which reaches an inside of the semiconductor substrate, forming a second insulating film on a sidewall of the opening, forming a conductive layer over the first insulating film and in the opening, removing the conductive layer over the first insulating film by polishing to form a second conductive via in the opening, forming a third insulating film over the first insulating film and the second conductive via, and forming, in the third insulating film, a third conductive via which reaches the first conductive via and a fourth conductive via which reaches the second conductive via.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 illustrates an example of a state after the etching of a second mask layer and an insulating film in the second embodiment;

FIGS. 19A, 19B, and 19C are views for describing an example of a wiring groove formation step in the fourth embodiment;

DESCRIPTION OF EMBODIMENTS

A first Embodiment will be described first.

FIGS. 1A, 1B, 1C, 1D, and 1E illustrate an example of a semiconductor device fabrication method according to a first embodiment.

Figure 1A:
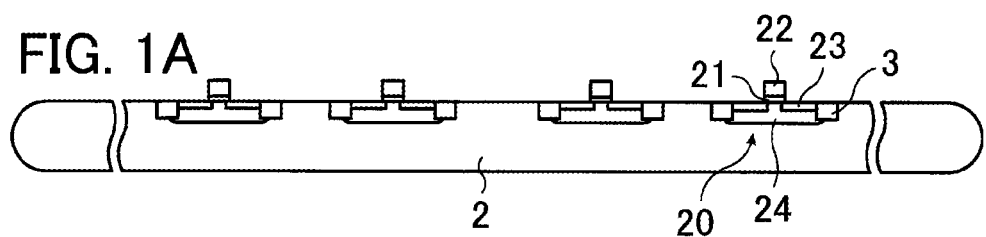
FIGS. 1A, 1B, 1C, 1D, and 1E illustrate an example of a semiconductor device fabrication method according to a first embodiment.

First, as illustrated in FIG. 1A, a semiconductor substrate 2, such as a silicon (Si) substrate, is prepared and isolation regions 3 are formed at determined positions in the semiconductor substrate 2. FIG. 1A illustrates the isolation regions 3 formed by an STI (shallow Trench Isolation) method. A transistor 20 is then formed in an element region defined by the isolation regions 3. A well region 24 of a determined conduction type is formed in the element region. The transistor 20 is formed in this well region 24. FIG. 1A illustrates as the transistor 20 a MOS transistor including a gate electrode formed over the semiconductor substrate 2 with a gate insulating film 21 between and impurity diffusion regions 23 of a determined conduction type formed on both sides of the gate electrode 22 in the semiconductor substrate 2. The impurity diffusion regions 23 on both sides of the gate electrode 22 function as a source and a drain of the transistor 20.

Figure 1B:
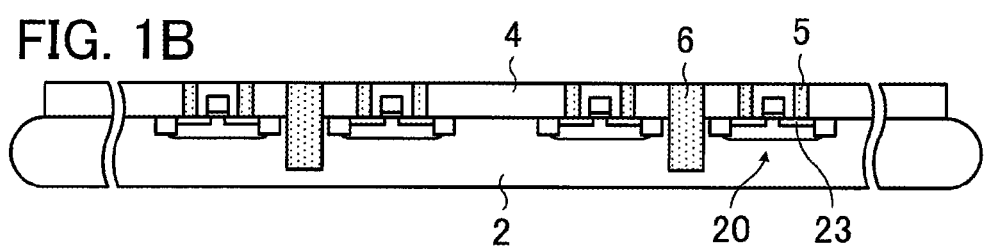

After the formation of the transistor 20, as illustrated in FIG. 1B, an insulating film 4 which covers the transistor 20 is formed. Conductive vias (plugs) 5 which pierce the insulating film 4 and which reach the impurity diffusion regions 23 of the transistor 20 and a conductive via 6 which pierces the insulating film 4 and which reaches the inside of the semiconductor substrate 2 are then formed. As described later, an insulating film (not illustrated) is formed between the semiconductor substrate 2 and the conductive via 6 in order to prevent leakage current from flowing between them.

Figure 1C:
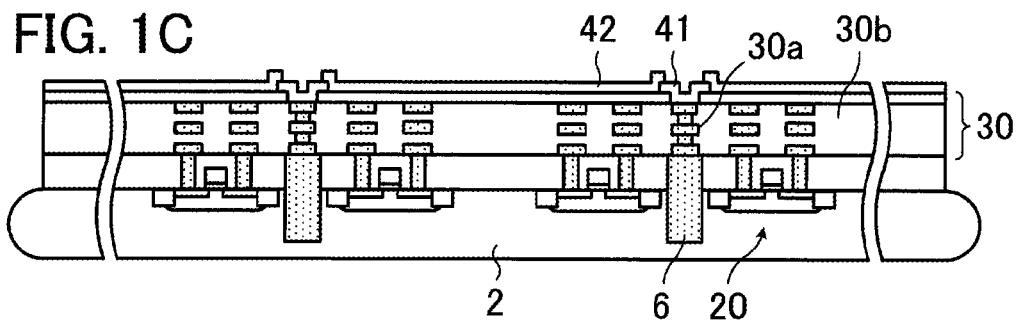

After the formation of the conductive vias 5 and 6, as illustrated in FIG. 1C, a multilayer interconnection 30 including conductive portions 30a, such as wirings and vias, which are electrically connected to the conductive vias 5 and 6 and an insulating layer 30b which covers the conductive portions 30a is formed. The number of wiring layers included in the multilayer interconnection 30 is not limited to that illustrated in FIGS. 1A, 1B, 1C, 1D, and 1E. A pad 41 and a cover film 42 are formed over the multilayer interconnection 30. FIG. 10 illustrates the pad 41 electrically connected to the conductive via 6 which reaches the inside of the semiconductor substrate 2.

Figure 1D:
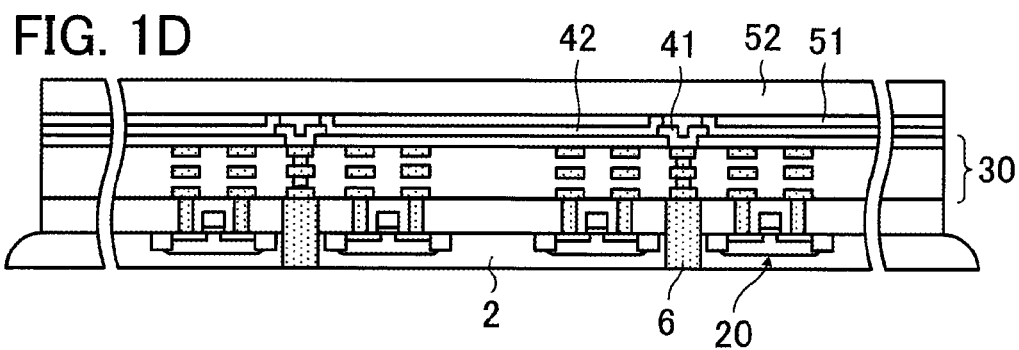

After the formation of the multilayer interconnection 30, as illustrated in FIG. 1D, a support board 52 is stuck on a side on which the multilayer interconnection 30 is formed by the use of an adhesive 51. A back of the semiconductor substrate 2 (side opposite to the side on which the support board 52 is stuck) is then ground (back grind) so that the conductive via 6 formed in the semiconductor substrate 2 will get exposed. By doing so, what is called a through silicon via (TSV) is obtained. This via pierces the semiconductor substrate 2.

Figure 1E:
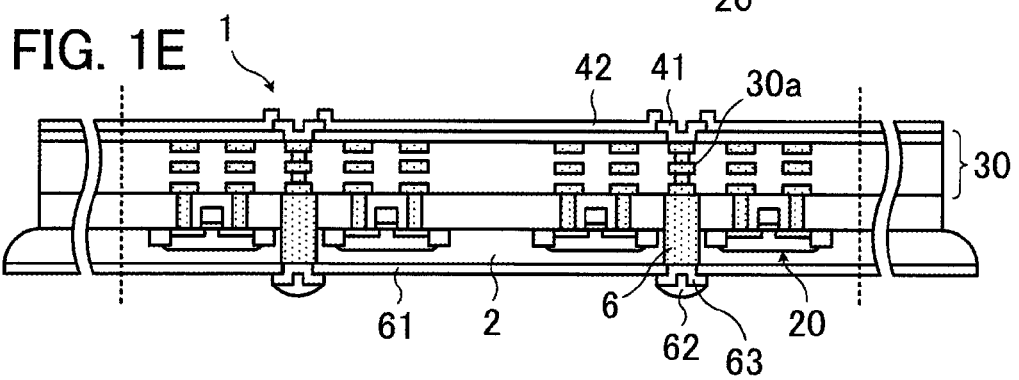

After the back grind, as illustrated in FIG. 1E, an insulating film 61 is formed over the back of the semiconductor substrate 2, an adherent conductive layer 63 and a bump 62 are formed over the conductive via 6 which gets exposed on the back, and the adhesive 51 and the support board 52 on the side on which the multilayer interconnection 30 is formed are removed. After that, dicing is performed, for example, at positions indicated by dotted lines in FIG. 1E to cut a wafer into individual semiconductor devices 1.

Individual semiconductor devices 1 can be stacked to form a semiconductor device having a stacked structure.

Figure 2:
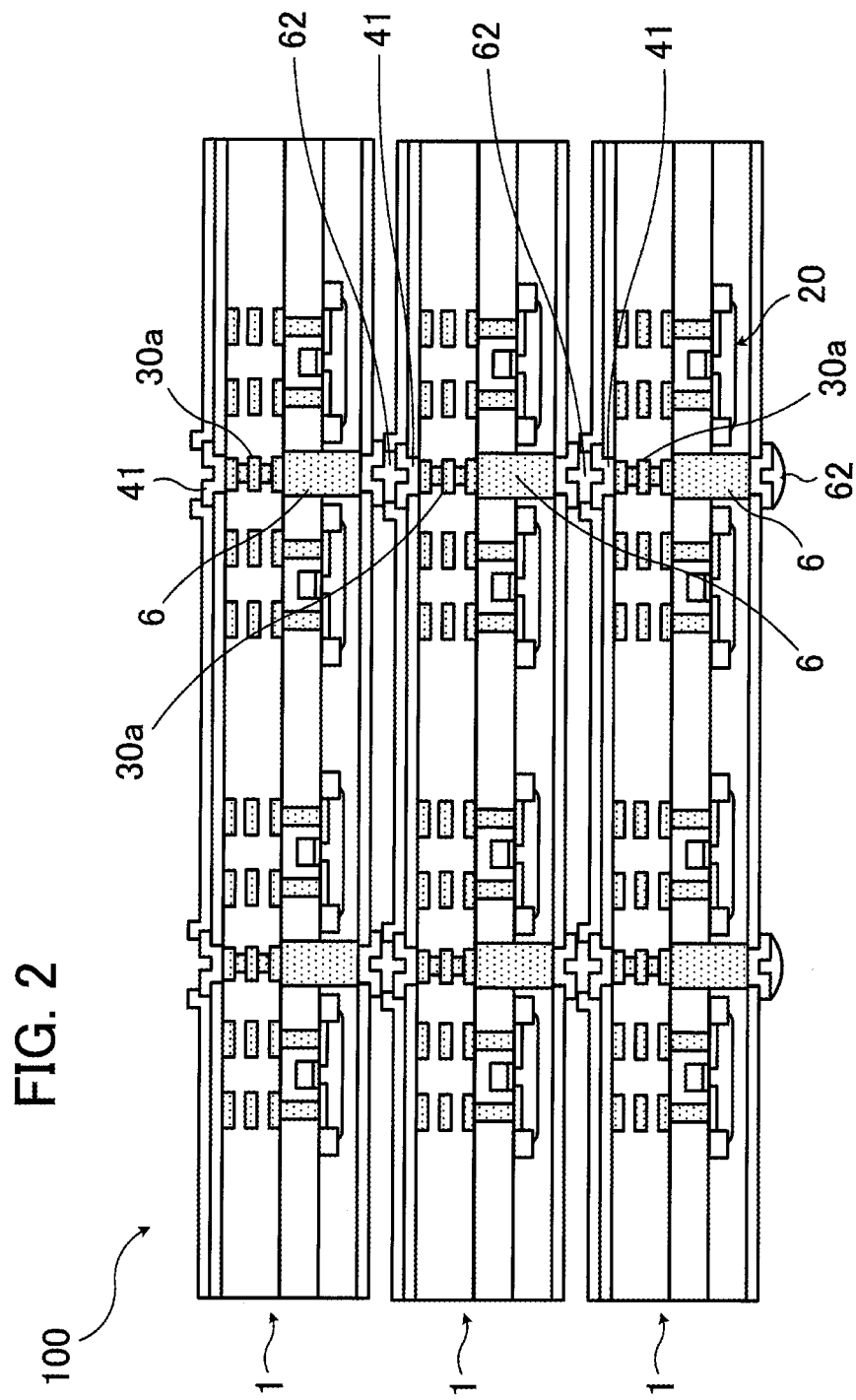
FIG. 2 illustrates an example of a semiconductor device having a stacked structure, according to the first embodiment.

FIG. 2 illustrates an example of a semiconductor device having a stacked structure, according to the first embodiment.

As illustrated in FIG. 2, individual semiconductor devices 1 are connected by their bumps 62 and pads 41. As a result, a semiconductor device 100 having a stacked structure in which the semiconductor devices 1 are electrically connected via the conductive portions 30a and TSVs including the conductive vias 6 can be obtained.

The step of forming the conductive vias 5 and 6 and steps after that step performed for fabricating the above semiconductor device 1 will now be described in further detail with reference to FIGS. 3A, 3B, and 3C through 7A and 7B.

Figure 3A:
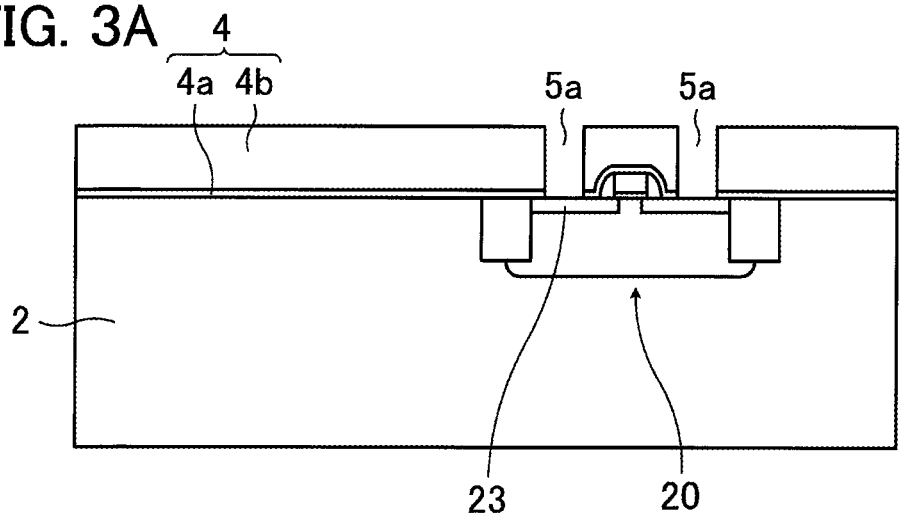
FIGS. 3A, 3B, and 3C are views for describing an example of a plug formation step in the first embodiment.
Figure 3B:
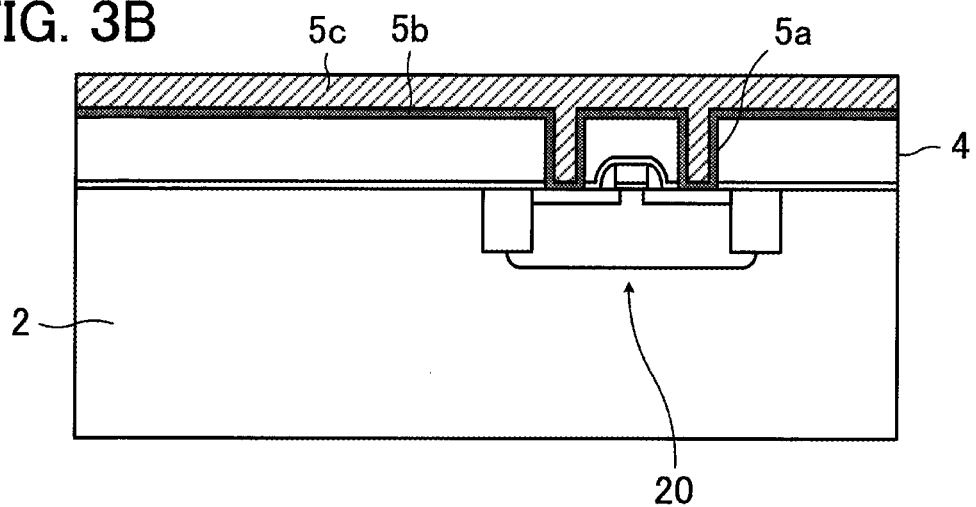
Figure 3C:
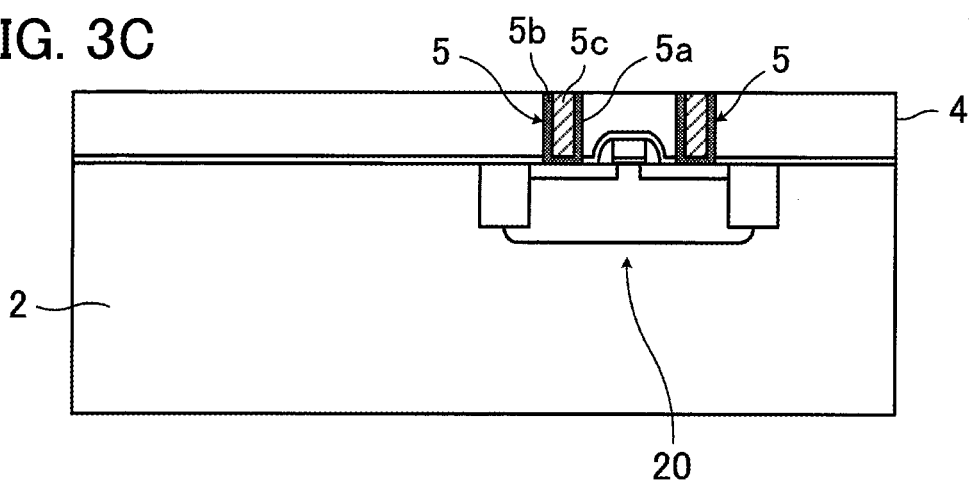

FIGS. 3A, 3B, and 3C are views for describing an example of a plug formation step in the first embodiment. FIG. 3A is a fragmentary schematic sectional view of a plug via hole formation step. FIG. 3B is a fragmentary schematic sectional view of a plug material formation step. FIG. 3C is a fragmentary schematic sectional view of a plug material polishing step.

As illustrated in FIG. 3A, first the insulating film 4 which covers the transistor 20 is formed over the semiconductor substrate 2 in which the transistor 20 is formed. In FIG. 3A, the insulating film 4 having a two-layer structure of insulating films 4a and 4b is formed as an example. A silicon nitride (SiN) film, for example, is formed as the lower insulating film 4a. A silicon oxide ($SiO_2$) film, for example, is formed as the upper insulating film 4b. The insulating film 4 (insulating films 4a and 4b) is formed by, for example, a CVD (Chemical Vapor Deposition) method. In that case, CMP (Chemical Mechanical Polishing) is performed for planarization after the insulating film 4 is deposited by the CVD method. The thickness of the insulating film 4 is, for example, 200 to 400 nm.

After the formation of the insulating film 4, as illustrated in FIG. 3A, via holes (contact holes) 5a which pierce the insulating film 4 and which reach the impurity diffusion regions 23 (source and the drain) of the transistor 20 are formed. The diameter of the via holes 5a is, for example, 40 to 200 nm. The height of the via holes 5a is equal to the thickness (200 to 400 nm, for example) of the insulating film 4.

After the formation of the via holes 5a, as illustrated in FIG. 3B, a conductive layer 5c, such as a tungsten (W) layer, is formed as a plug material in the via holes 5a and over the insulating film 4 with a barrier metal film (barrier film) 5b between. For example, a layer of one of titanium (Ti), tantalum (Ta), titanium nitride (TiN), and tantalum nitride (TaN) or a lamination layer of two or more of them is formed as the barrier metal film 5b by a sputtering method, the CVD method, or the like. The barrier metal film 5b carries out the function of preventing an element from diffusing from the W layer 5c. In addition, the W layer 5c is formed by, for example, the CVD method.

After the formation of the barrier metal film 5b and the W layer 5c, the barrier metal film 5b and the W layer 5c formed over the insulating film 4 are removed by polishing. For example, the barrier metal film 5b and the W layer 5c are polished by the CMP until the insulating film 4 gets exposed. By removing the barrier metal film 5b and the W layer 5c formed over the insulating film 4, as illustrated in FIG. 3C, the conductive vias 5 are formed in the via holes 5a. That is to say, the W layer 5c is formed in the via holes 5a with the barrier metal film 5b between.

Figure 4A:
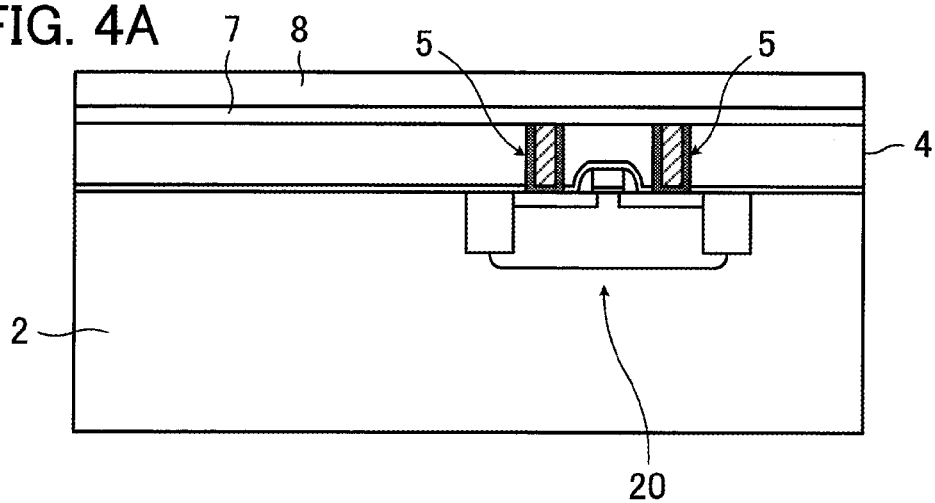
FIGS. 4A, 4B, and 4C are views for describing an example of a TSV via hole formation step in the first embodiment.
Figure 4B:
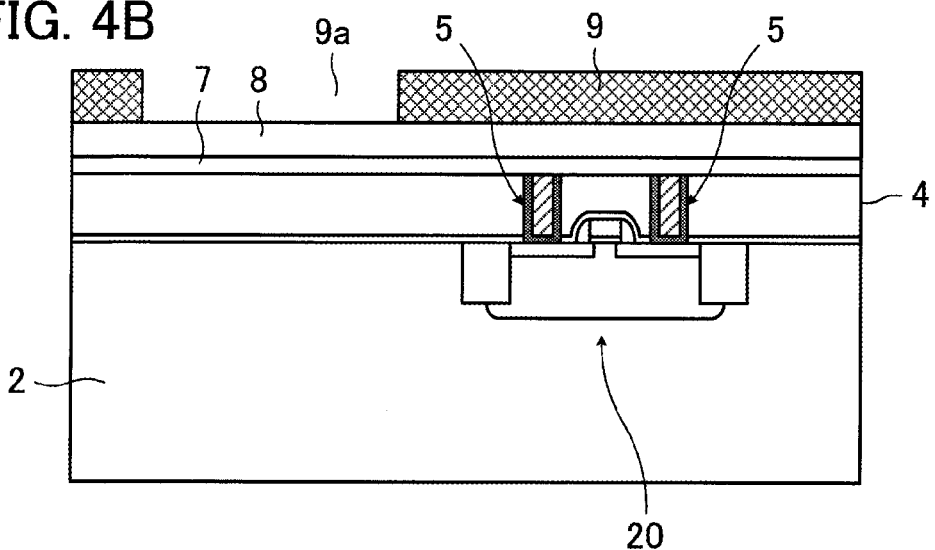
Figure 4C:
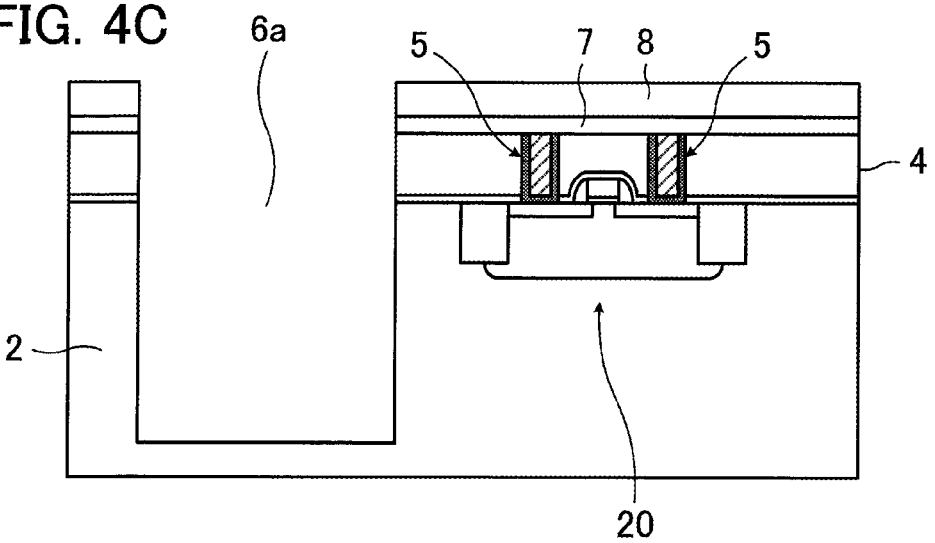

FIGS. 4A, 4B, and 4C are views for describing an example of a TSV via hole formation step in the first embodiment. FIG. 4A is a fragmentary schematic sectional view of a mask layer formation step. FIG. 4B is fragmentary schematic sectional view of a resist pattern formation step. FIG. 4C is a fragmentary schematic sectional view of a TSV via hole formation step.

After the formation of the conductive vias 5, as illustrated in FIG. 4A, a first mask layer 7 and a second mask layer 8 are formed over the conductive vias 5 and the insulating film 4. For example, a SiN film with a thickness of 50 to 100 nm is formed by the CVD method as the first mask layer 7. For example, a $SiO_2$ film with a thickness of 100 to 200 nm is formed by the CVD method as the second mask layer 8.

After the formation of the first mask layer 7 and the second mask layer 8, as illustrated in FIG. 4B, a resist pattern 9 having an opening 9a at a position at which a TSV is to be formed is formed over the second mask layer 8. The diameter of the opening 9a is, for example, 10 to 50 µm. The thickness of the resist pattern 9 is, for example, 2 to 4 µm.

After the formation of the resist pattern 9, etching is performed with it as a mask. By doing so, as illustrated in FIG. 4C, a TSV via hole (opening) 6a which pierces the second mask layer 8, the first mask layer 7, and the insulating film 4 and which reaches the inside of the semiconductor substrate 2 is formed.

To form the via hole 6a, first the second mask layer 8 is etched with the resist pattern 9 as a mask. If the second mask layer 8 is a $SiO_2$ film, then the second mask layer 8 is etched by the use of, for example, argon (Ar) and hexafluorobutane ($C_4F_6$).

After the etching of the second mask layer 8, the first mask layer 7 is etched. If the first mask layer 7 is a SiN film, then the first mask layer 7 is etched by the use of, for example, Ar, difluoromethane ($CH_2F_2$), and oxygen ($O_2$).

After the etching of the first mask layer 7, the insulating film 4 is etched. If the insulating film 4 includes two layers, that is to say, a SiN film (insulating film 4a) and a $SiO_2$ film (insulating film 4b), then the $SiO_2$ film is etched by the use of, for example, Ar and $C_4F_6$ and the SiN film is etched by the use of, for example, Ar, $CH_2F_2$, and $O_2$.

After the etching of the insulating film 4, the semiconductor substrate 2 is etched. If the semiconductor substrate 2 is a Si substrate, then the semiconductor substrate 2 is etched by the use of, for example, hexafluorosulfide ($SF_6$) and $O_2$.

The via hole 6a which reaches the inside of the semiconductor substrate 2 is made in this way. The depth of the via hole 6a is, for example, 100 to 200 µm.

Figure 5A:
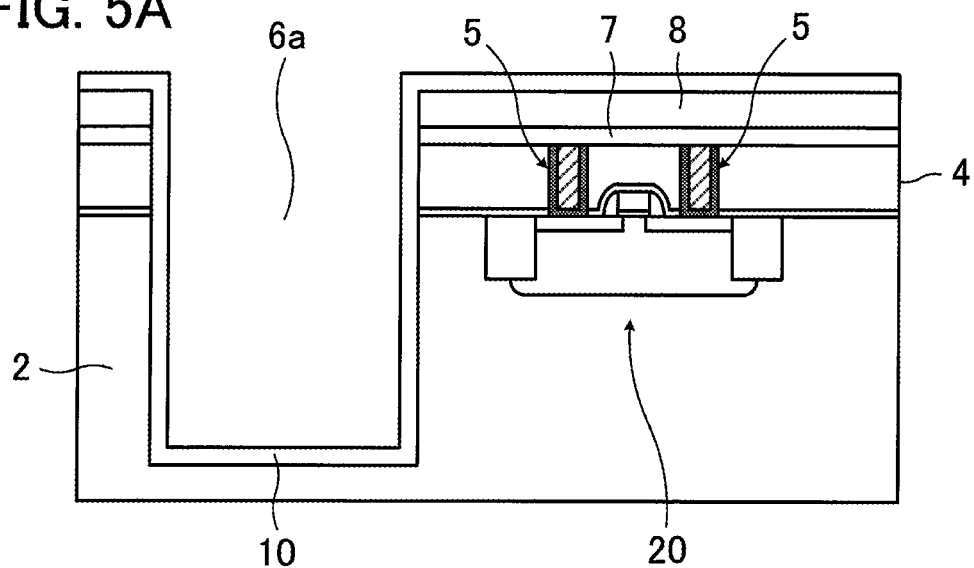
FIGS. 5A and 5B are views for describing an example of a TSV via hole filling step in the first embodiment.
Figure 5B:
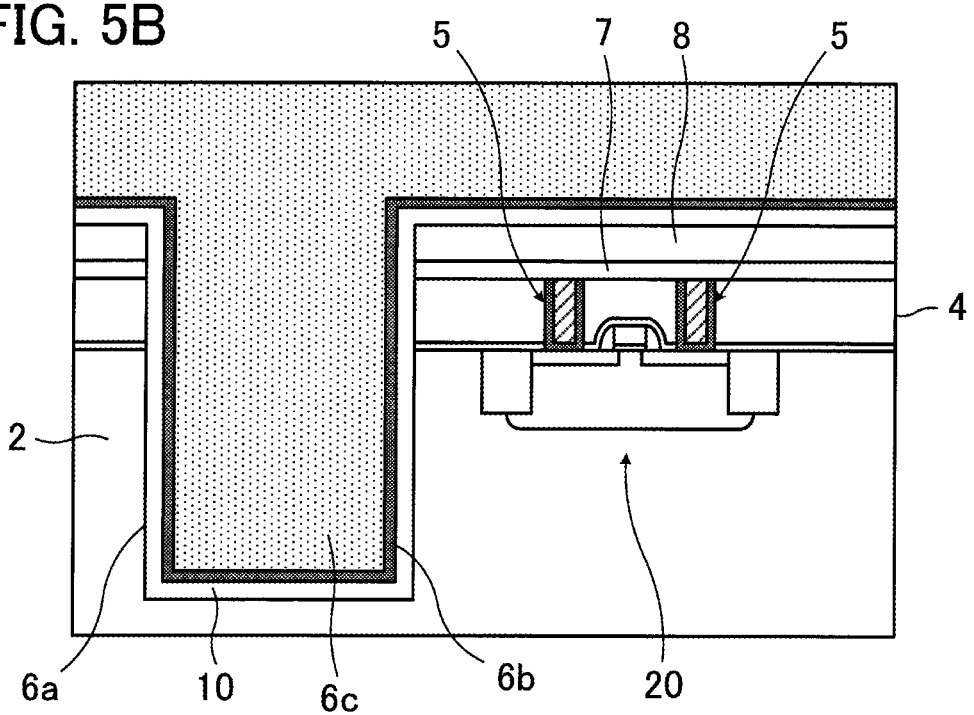

FIGS. 5A and 5B are views for describing an example of a TSV via hole filling step in the first embodiment. FIG. 5A is a fragmentary schematic sectional view of an insulating film formation step. FIG. 5B is a fragmentary schematic sectional view of a TSV material formation step.

After the making of the via hole 6a, as illustrated in FIG. 5A, an insulating film 10 is formed over an inside of the via hole 6a. For example, a silicon carbide (SiC) film, a $SiO_2$ film, or a SiN film is formed as the insulating film 10. The insulating film 10 can be formed by the CVD method. In that case, as illustrated in FIG. 5A, the insulating film 10 is formed over the inside of the via hole 6a and the second mask layer 8. The insulating film 10 is formed so that the thickness of the insulating film 10 formed over the inside of the via hole 6a will be, for example, about 100 nm.

The insulating film 10 formed over the inside of the via hole 6a carries out the function of preventing leakage current from flowing to the semiconductor substrate 2. That is to say, when the via hole 6a is filled in with a metal material as described later, the insulating film 10 prevents the metal material from diffusing into the semiconductor substrate 2, prevents the surface of the semiconductor substrate 2 in the via hole 6a from changing into silicide, and prevents leakage current from flowing to the semiconductor substrate 2.

After the formation of the insulating film 10, as illustrated in FIG. 5B, a conductive layer 6c is formed in the via hole 6a and over the insulating film 10 as a TSV material with a barrier metal film (barrier film) 6b between.

For example, a layer of one of Ti, Ta, TiN, and TaN or a lamination layer of two or more of them is formed as the barrier metal film 6b by the sputtering method, the CVD method, or the like. The thickness of the barrier metal film 6b is, for example, 30 to 100 nm. The barrier metal film 6b carries out the function of preventing an element from diffusing from the conductive layer 6c For example, a copper (Cu) layer or a layer made mainly of Cu is formed as the conductive layer 6c by a plating method. For example, the conductive layer 6c is formed by the plating method in the following way. A seed layer is formed over the barrier metal film 6b and the conductive layer 6c is formed by an electrolytic plating process by the use of the seed layer.

The via hole 6a is filled in with the barrier metal film 6b and the conductive layer 6c in this way.

Figure 6A:
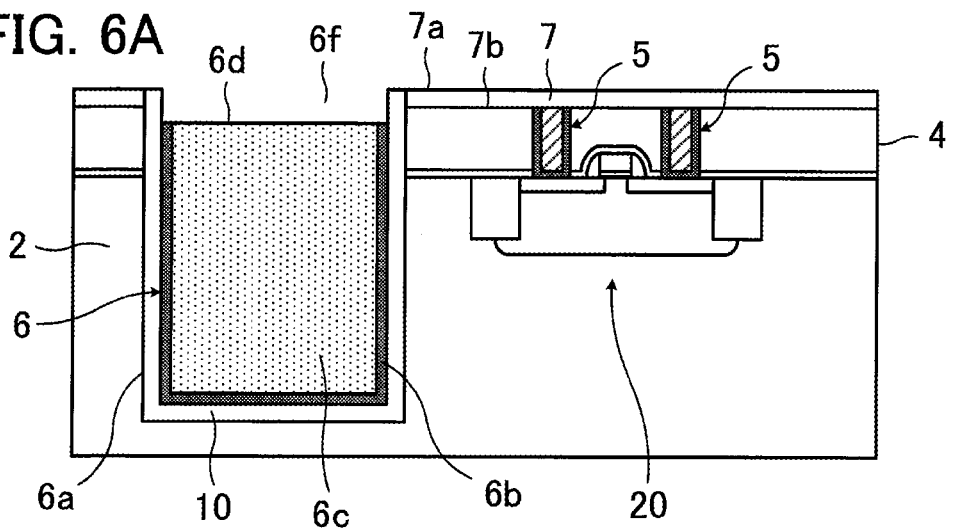
FIGS. 6A, 6B, and 6C are views for describing an example of a polishing and cap film formation step in the first embodiment.
Figure 6B:
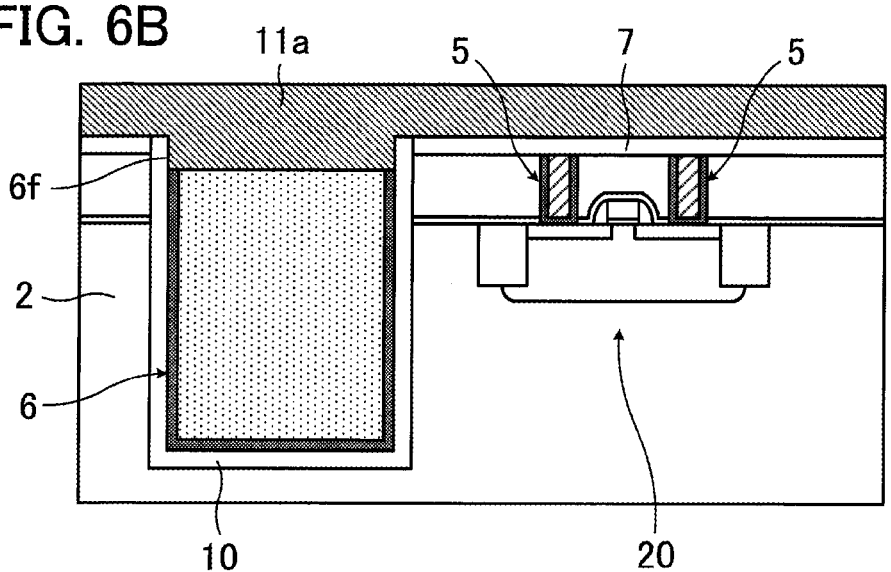
Figure 6C:
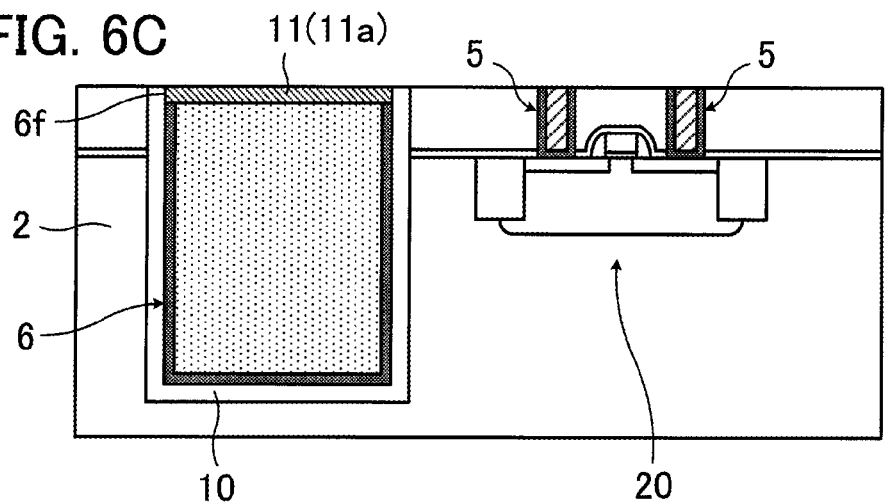

FIGS. 6A, 6B, and 6C are views for describing an example of a polishing and cap film formation step in the first embodiment. FIG. 6A is a fragmentary schematic sectional view of a TSV material polishing step. FIG. 6B is a fragmentary schematic sectional view of a cap film material formation step. FIG. 6C is a fragmentary schematic sectional view of a cap film material polishing step.

After the formation of the barrier metal film 6b and the conductive layer 6c, the conductive layer 6c and the barrier metal film 6b formed over the insulating film 10 are removed by polishing and the insulating film 10 and the second mask layer 8 are removed by polishing. By polishing the conductive layer 6c, the barrier metal film 6b, the insulating film 10, and the second mask layer 8, as illustrated in FIG. 6A, the first mask layer 7 gets exposed. When this polishing is performed, the first mask layer 7 functions as a stopper. The conductive layer 6c, the barrier metal film 6b, the insulating film 10, and the second mask layer 8 can be polished by the CMP.

By polishing the conductive layer 6c, the barrier metal film 6b, the insulating film 10, and the second mask layer 8 in this way, the conductive layer 6c is formed in the via hole 6a with the barrier metal film 6b between and the conductive via 6 is formed in the via hole 6a.

As illustrated in FIG. 6A, for example, the conductive layer 6c, the barrier metal film 6b, the insulating film 10, and the second mask layer 8 are polished so that there will be a difference in level between an upper side 6d of the conductive via 6 after the polishing and an upper side 7a of the first mask layer 7 (upper end of the via hole 6a after the polishing). A hollow 6f is made in this way over the conductive via 6 and, as described later, a cap film (metal cap film) made mainly of metal is formed in the hollow 6f. If a metal cap film is formed in this way, the hollow 6f is made so that it will have depth by which the upper side 6d of the conductive via 6 is lower than an under side 7b of the first mask layer 7 (upper side of the insulating film 4).

The hollow 6f can be made by making a dishing occur at the time of polishing the conductive layer 6c, the barrier metal film 6b, the insulating film 10, and the second mask layer 8. The diameter (10 to 50 nm in this example) of the conductive via 6 which is to be used as a TSV is larger than that of the conductive vias 5 which are to be used as plugs, so a dishing tends to occur in the conductive layer 6c at polishing time. Such a dishing occurs and the above hollow 6f is made. In order to control the depth of the hollow 6f, polishing conditions are adjusted. By adjusting conditions such as a load applied to a polishing pad used for polishing, the quality of a material for the polishing pad, ingredients of slurry (including the quality of a material for and size of abrasive grains), and polishing time, a dishing can be made to occur, and the hollow 6f having desired depth can be made.

After the conductive via 6 is formed by performing polishing in the above way so as to make the hollow 6f, a metal layer 11a (cap film material) for a metal cap film is formed in the hollow 6f and over the first mask layer 7 as illustrated in FIG. 6B.

The metal layer 11a can be formed by the plating method. For example, the metal layer 11a is formed in the hollow 6f and over the first mask layer 7 by an electroless plating method. Alternatively, a seed layer is formed over an inside of the hollow 6f and the upper side 7a of the first mask layer 7 and is used for forming the metal layer 11a by the electrolytic plating process. Furthermore, the metal layer 11a can be formed by a film formation method, such as an ALD (Atomic Layer Deposition) method or the CVD method, other than these plating methods. For example, a cobalt tungsten phosphorus (CoWP) layer is formed as the metal layer 11a. Alternatively, a layer which contains zirconium boride (ZrB), W, Ti, Ta, cobalt (Co), ruthenium (Ru), platinum (Pt), ruthenium tungsten (RuW), cobalt tungsten (CoW), or the like can be formed as the metal layer 11a.

After the formation of the metal layer 11a, as illustrated in FIG. 6C, the metal layer 11a formed over the upper side 7a of the first mask layer 7 is removed by polishing and the first mask layer 7 is removed by polishing. The metal layer 11a and the first mask layer 7 can be polished by the CMP. When the metal layer 11a is polished, the first mask layer 7 functions as a stopper.

As has been described, the hollow 6f is made more deeply than the first mask layer 7 and the metal layer 11a is formed in the hollow 6f. By doing so, the metal layer 11a remains on the surface of the conductive via 6 after the polishing of the metal layer 11a and the first mask layer 7. The metal layer 11a which remains on the surface of the conductive via 6 functions as a metal cap film 11. The metal cap film 11 carries out the function of preventing a conductive material, such as Cu, with which the via hole 6a having great volume is filled in from diffusing outside the via hole 6a. In addition, the metal cap film 11 carries out the function of improving adhesion of an insulating film (cap film 33a described later, for example) formed over the metal cap film 11.

After that, the multilayer interconnection 30 including wiring layers is formed.

Figure 7A:
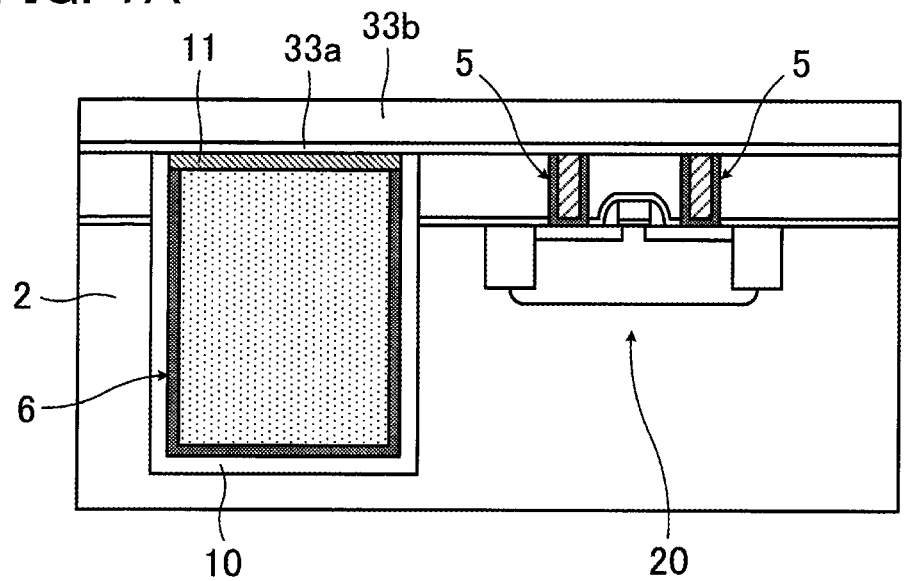
FIGS. 7A and 7B are views for describing an example of a wiring layer formation step in the first embodiment.
Figure 7B:
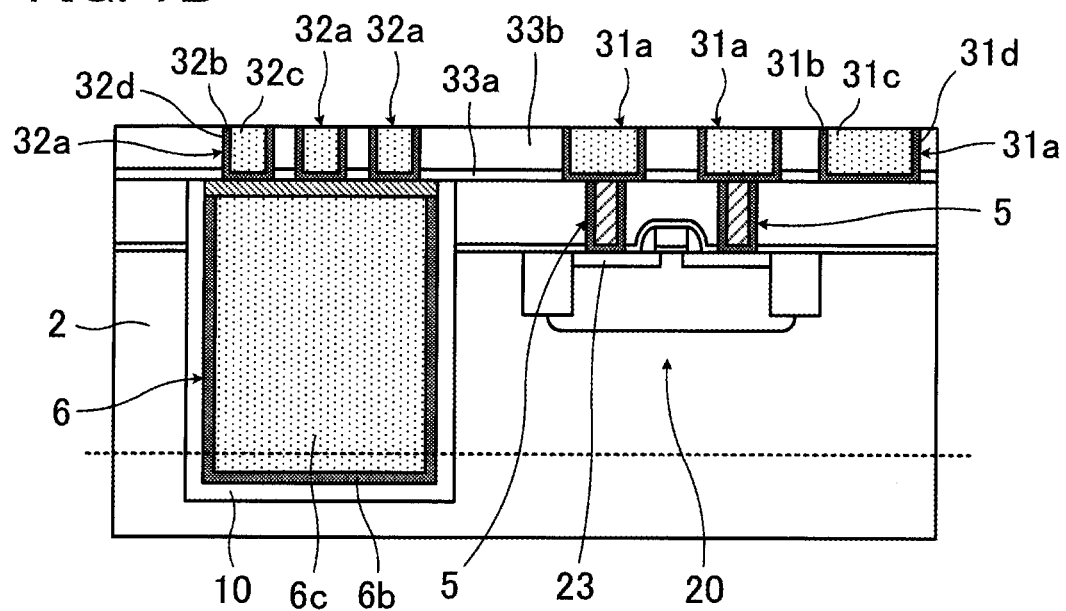

FIGS. 7A and 7B are views for describing an example of a wiring layer formation step in the first embodiment. FIG. 7A is a fragmentary schematic sectional view of a cap film and interlayer dielectric formation step. FIG. 7B is a fragmentary schematic sectional view of a wiring and conductive via formation step.

After the steps to the formation of the metal cap film 11 are performed in the above way, first an insulating cap film 33a is formed as illustrated in FIG. 7A. As illustrated in FIG. 7A, an interlayer dielectric 33b is formed over the cap film 33a. For example, a SiC film with a thickness of 30 to 100 nm is formed as the cap film 33a by the CVD method. For example, a $SiO_2$ or silicon oxide carbide (SiOC) film with a thickness of 100 to 400 nm is formed as the interlayer dielectric 33b by the CVD method.

After the formation of the cap film 33a and the interlayer dielectric 33b, as illustrated in FIG. 7B, wirings 31a and 32a are formed. Each wiring 31a includes a barrier metal film (barrier film) 31b and a conductive layer 31c formed with the barrier metal film 31b between. Each wiring 32a includes a barrier metal film (barrier film) 32b and a conductive layer 32c formed with the barrier metal film 32b between. The barrier metal films 31b and 32b carry out the function of preventing an element from diffusing from the conductive layers 31c and 32c respectively.

As illustrated in FIG. 7B, the wirings 31a are formed so as to pierce the cap film 33a and the interlayer dielectric 33b and to reach the conductive vias 5 connected to the impurity diffusion regions 23 (source and the drain) of the transistor 20. As illustrated in FIG. 7B, a wiring 31a may not be formed over a conductive via 5.

The wirings 32a are formed so as to pierce the cap film 33a and the interlayer dielectric 33b and to reach the metal cap film 11 over the conductive via 6. In this example, the wirings 32a are formed so that they will be electrically connected to the one conductive via 6.

These wirings 31a and 32a can be formed in block by a single damascene process. That is to say, wiring grooves 31d and 32d which pierce the cap film 33a and the interlayer dielectric 33b are formed first at determined positions by photolithography and etching. A barrier metal film and a conductive layer are then formed in the wiring grooves 31d and 32d and over the interlayer dielectric 33b. The barrier metal film and the conductive layer formed over the interlayer dielectric 33b are removed by the CMP. As a result, the conductive layer 31c is formed in the wiring grooves 31d with the barrier metal film 31b between and the wirings 31a are obtained in the wiring grooves 31d. Furthermore, the conductive layer 32c is formed in the wiring grooves 32d with the barrier metal film 32b between and the wirings 32a are obtained in the wiring grooves 32d.

A first wiring layer in the multilayer interconnection 30 is formed in this way. Second and later wiring layers can be formed in the same way as the first wiring layer is formed. That is to say, after the formation of the wirings 31a and 32a, a cap film with determined thickness and an interlayer dielectric with determined thickness are formed over the interlayer dielectric 33b, wirings and vias which pierce the formed cap film and interlayer dielectric are formed at determined positions, and the second wiring layer in the multilayer interconnection 30 is formed. A third and later wiring layers in the multilayer interconnection 30 are formed through the same procedure.

The wirings 31a and 32a in the first wiring layer are formed by the single damascene process. However, when each wiring layer in the multilayer interconnection is formed, wirings and vias may be formed by a dual damascene process.

A determined number of wiring layers are formed through the above procedure and the multilayer interconnection 30 is obtained. As illustrated in FIG. 10, the pad 41 and the cover film 42 are formed over the multilayer interconnection 30. After that, as illustrated in FIGS. 1D and 1E, back grind of the semiconductor substrate 2 is performed so that the conductive via 6 will get exposed, the bump 62 and the like are formed, dicing is performed, and individual semiconductor devices 1 are completed.

When the conductive via 6 formed in the above way gets exposed by the back grind, it is desirable from the viewpoint of the formation of a low-resistance TSV that the conductive layer 6c of the conductive via 6 made of Cu or made mainly of Cu get exposed on the back of the semiconductor substrate 2. That is to say, it is desirable to perform back grind to a position indicated by a dotted line for convenience in FIG. 7B.

With the method according to the first embodiment for fabricating the semiconductor device 1, as has been described in the foregoing, the transistor 20 is formed, the conductive vias 5 connected to the transistor and the conductive via 6 which reaches the inside of the semiconductor substrate 2 are formed, and then the multilayer interconnection 30 is formed.

A case where a conductive via which reaches the inside of a semiconductor substrate is formed after the formation of a multilayer interconnection will now be described for comparison.

FIGS. 8A, 8B, 8C, and 8D illustrate another example of a semiconductor device fabrication method.

Figure 8A:
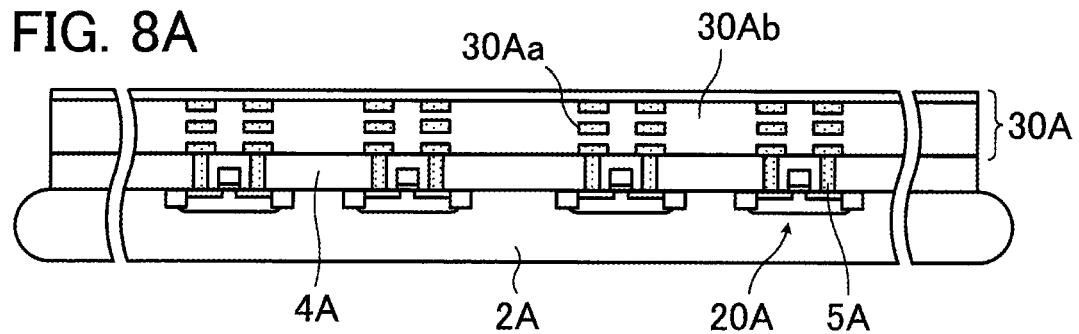
FIGS. 8A, 8B, 8C, and 8D illustrate another example of a semiconductor device fabrication method.

As illustrated in FIG. 8A, first a transistor 20A is formed in a semiconductor substrate 2A. After an insulating film 4A which covers the transistor 20A and conductive vias 5A connected to the transistor 20A are formed, a multilayer interconnection 30A including conductive portions 30Aa and an insulating layer 30Ab is formed over the insulating film 4A.

Figure 8B:
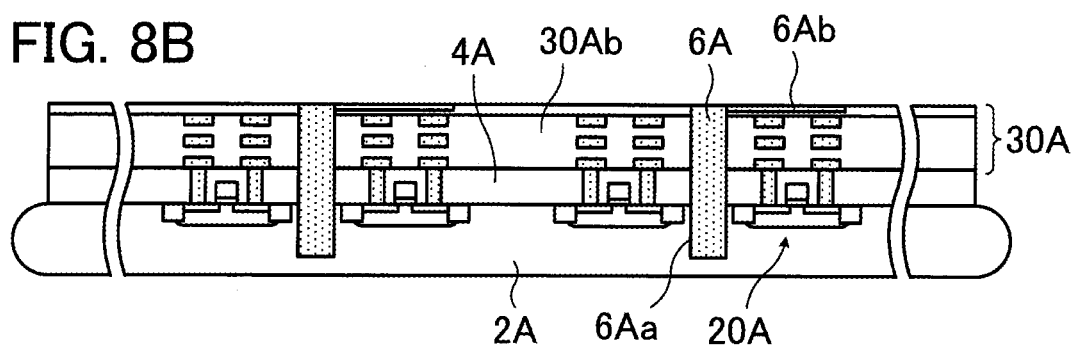

After the formation of the multilayer interconnection 30A, as illustrated in FIG. 8B, a conductive via 6A which pierces the multilayer interconnection 30A and the insulating film 4A and which reaches the inside of the semiconductor substrate 2A. Before the conductive via 6A is formed, an insulating film (not illustrated) corresponding to the insulating film 10 described in the above first embodiment is formed over an inside of a via hole 6Aa. In addition, a rewiring 6Ab connected to the conductive via 6A is formed as an uppermost layer by, foe example, a damascene process.

Figure 8C:
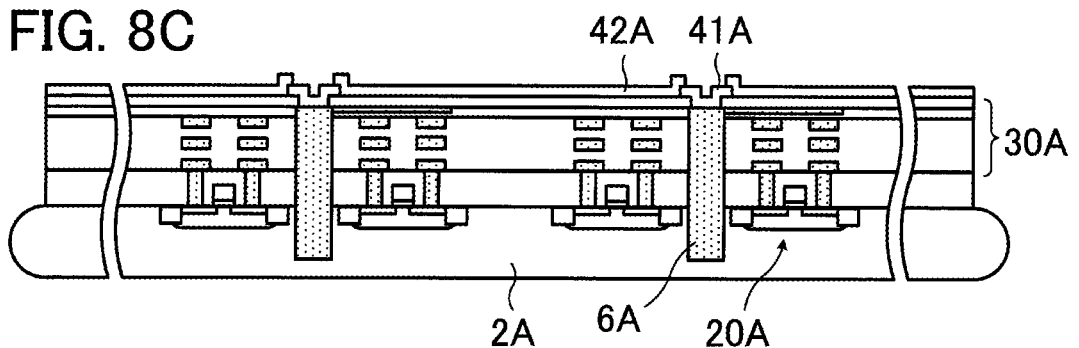

As illustrated in FIG. 8C, a pad 41A and a cover film 42A are formed over the multilayer interconnection 30A in which the conductive via 6A and the like are formed.

Figure 8D:
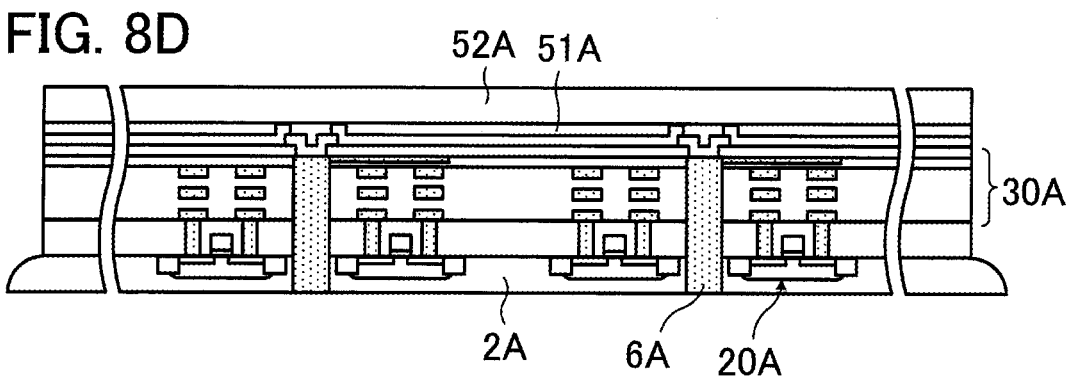

After that, as illustrated in FIG. 8D, back grind of the semiconductor substrate 2A is performed by the use of an adhesive 51A and a support board 52A so that the conductive via 6A will get exposed on a back of the semiconductor substrate 2A.

After that, the formation of a bump and the like over the back of the semiconductor substrate 2A and dicing are performed in the same way that is described in FIG. 1E.

With the method illustrated in FIGS. 8A, 8B, 8C, and 8D, the conductive via 6A is formed in the following way. After the multilayer interconnection 30A is formed as illustrated in FIG. 8A, the via hole 6Aa is formed at the next step illustrated in FIG. 8B. The via hole 6Aa is formed by etching so that it will pierce all wiring layers (insulating layer 30Ab) included in the multilayer interconnection 30A and the insulating film 4A and so that it will reach the inside of the semiconductor substrate 2A. However, the insulating layer 30Ab includes films, such as a cap film and an interlayer dielectric, which differ in the quality of material. Accordingly, when the via hole 6Aa is formed, it is necessary to etch the insulating layer 30Ab including the films which differ in the quality of material. If the films which differ in the quality of material are etched in order from the top by changing etching conditions, then an etching process becomes complex. Furthermore, if all the films are etched in block, it may be impossible to make the via hole 6Aa with accuracy. For example, a sidewall of the via hole 6Aa may become irregular. For example, if the sidewall of the via hole 6Aa becomes irregular, a barrier metal film is not formed uniformly on the sidewall of the via hole 6Aa. That is to say, a formed barrier metal film does not cover all of the sidewall of the via hole 6Aa. Accordingly, leakage current may flow between the conductive via 6A and the semiconductor substrate 2A.

In addition, with the method illustrated in FIGS. 8A, 8B, 8C, and 8D, the via hole 6Aa which pierces the multilayer interconnection 30A is made and the conductive via 6A is formed in the via hole 6Aa. Accordingly, a wiring or a via may not be formed at a position in the multilayer interconnection 30A at which the conductive via 6A is to be formed later. Furthermore, a dummy wiring may not be formed at a position in the multilayer interconnection 30A at which the conductive via 6A is to be formed later. A dummy wiring is often formed in a multilayer interconnection in order to secure the flatness of each layer (in order to avoid a dishing in a conductive portion) in the CMP performed in a multilayer interconnection formation process. However, if a conductive via which reaches the inside of a semiconductor substrate is formed after the formation of a multilayer interconnection, then a dummy wiring is arranged at a position other than a position at which the conductive via is to be formed. As a result, for example, it may be impossible to secure the flatness of each wiring layer in the multilayer interconnection. A deterioration in the flatness of a first wiring layer leads to a decrease in the accuracy of exposure in photolithography performed at the time of forming a second wiring layer over the first wiring layer. Accordingly, it may be impossible to accurately form a conductive via and a wiring in the second wiring layer. In addition, if a conductive via which reaches the inside of a semiconductor substrate is formed after the formation of a multilayer interconnection in which a dummy wiring is arranged, then a position at which the conductive via can be formed may be influenced by the arrangement of the dummy wiring.

With the method according to the above first embodiment for fabricating the semiconductor device 1, on the other hand, the conductive via 6 which reaches the inside of the semiconductor substrate 2 is formed before the multilayer interconnection 30 is formed. The via hole 6a in which the conductive via 6 is formed can be formed by etching the insulating film 4 and the semiconductor substrate 2 by the use of the first mask layer 7 and the second mask layer 8. With the method illustrated in FIGS. 8A, 8B, 8C, and 8D, the via hole 6Aa is made after the multilayer interconnection 30A is formed. In this case, an etching process becomes complex or the via hole 6Aa may not be made with accuracy. Unlike the method illustrated in FIGS. 8A, 8B, 8C, and 8D, these problems do not arise in the method according to the above first embodiment for fabricating the semiconductor device 1.

Furthermore, with the method according to the above first embodiment for fabricating the semiconductor device 1, the conductive via 6 is formed before the multilayer interconnection 30 is formed. Accordingly, even if a dummy wiring is arranged in the multilayer interconnection 30, the dummy wiring can be arranged more flexibly. This makes it possible to form the multilayer interconnection 30 including wiring layers with good flatness and connection accuracy and to prevent a position at which the conductive via 6 is formed and a position at which a dummy wiring is formed from influencing each other.

If a conductive via (TSV) which pierces a semiconductor substrate is formed, a method in which a conductive via is formed by forming a via hole from a semiconductor substrate side may be adopted in addition to the above method which is described in FIGS. 8A, 8B, 8C, and 8D and in which a conductive via is formed by forming a via hole from a multilayer interconnection side.

FIGS. 9A, 9B, 9C, and 9D illustrate still another example of a semiconductor device fabrication method.

Figure 9A:
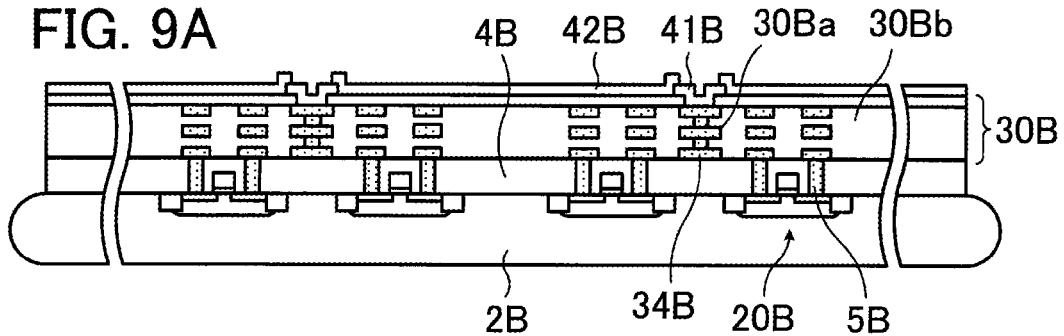
FIGS. 9A, 9B, 9C, and 9D illustrate still another example of a semiconductor device fabrication method.

As illustrated in FIG. 9A, first a transistor 20B is formed in a semiconductor substrate 2B. After an insulating film 4B which covers the transistor 20B and conductive vias 5B connected to the transistor 20B are formed, a multilayer interconnection 30B including conductive portions 30Ba and an insulating layer 30Bb is formed over the insulating film 4B. A pad 41B and a cover film 42B are formed over the multilayer interconnection 30B.

Figure 9B:
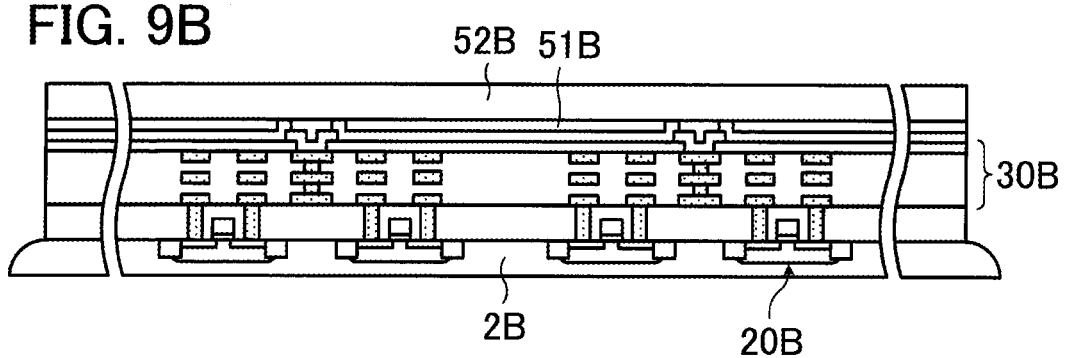

After that, as illustrated in FIG. 9B, back grind of the semiconductor substrate 2B is performed by the use of an adhesive 51B and a support board 52B.

Figure 9C:
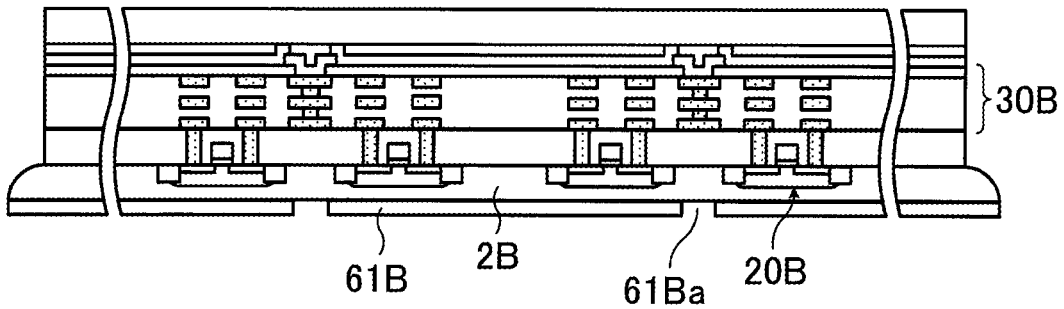

After that, as illustrated in FIG. 9C, an insulating protection film 61B in which an opening 61Ba is formed at a position at which a conductive via (TSV) is to be formed is formed over a surface (ground surface) of the semiconductor substrate 2B on which back grind has been performed. For example, after the protection film 61B is formed over the surface on which back grind has been performed, the opening 61Ba is formed by photolithography and etching.

Figure 9D:
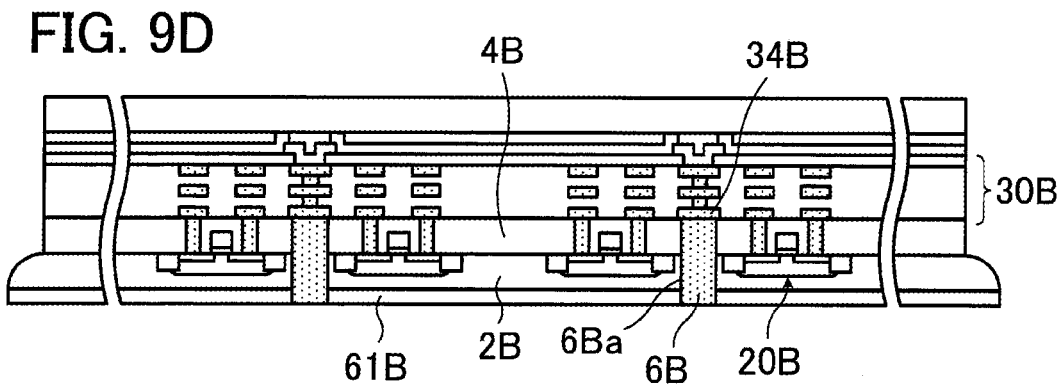

Etching is then performed with the protection film 61B as a mask. As illustrated in FIG. 9D, a via hole 6Ba which pierces the semiconductor substrate 2B and the insulating film 4B and which reaches the multilayer interconnection 30B is formed and a conductive via 6B is formed in the via hole 6Ba. Before the conductive via 6B is formed, an insulating film (not illustrated) corresponding to the insulating film 10 described in the above first embodiment is formed over an inside of the via hole 6Ba. In addition, a wiring 34B which functions as a stopper at the time of making the via hole 6Ba and which is to be connected to the conductive via 6B formed in the via hole 6Ba is formed in advance in the multilayer interconnection 30B. As illustrated in FIG. 9D, for example, the wiring 34B is formed in a first wiring layer of the multilayer interconnection 30B formed over the insulating film 4B.

After that, the formation of a bump and the like over a back of the semiconductor substrate 2B and dicing are performed in the same way that is described in FIG. 1E.

With the method illustrated in FIGS. 9A, 9B, 9C, and 9D, in order to make the via hole 6Ba, the protection film 61B in which the opening 61Ba is formed is formed over the side of the semiconductor substrate 2B on which back grind has been performed. However, if an alignment mark or the like is not put separately on the surface on which back grind has been performed or the protection film 61B, it is difficult to form the opening 61Ba with accuracy. Accordingly, it is difficult to make the via hole 6Ba at a determined position with accuracy.

Furthermore, there may be positional deviations or the like of the conductive portions (wirings and vias) 30Ba included in the multilayer interconnection 30B which is already formed. In that case, even if the via hole 6Ba is made at a proper position in the surface on which back grind has been performed, the conductive via 6B may be connected to a wiring or the like in the multilayer interconnection 30B to which the conductive via 6B is not to be connected, or may not be connected to the wiring 34B to which the conductive via 6B is to be connected.

In addition, in order to prevent leakage current, the via hole 6Ba which pierces the semiconductor substrate 2B after back grind and which reaches the wiring 34B in the multilayer interconnection 30B is made and then the insulating film is formed over the inside of the via hole 6Ba. In that case, however, the step of removing the insulating film which covers the bottom of the via hole 6Ba (under side of the wiring 34B) is necessary for securing continuity between the conductive via 6B subsequently formed and the wiring 34B to which the conductive via 6B is to be connected.

With the method according to the above first embodiment for fabricating the semiconductor device 1, on the other hand, after the transistor 20 and the conductive vias 5 are formed and before the multilayer interconnection 30 is formed, the via hole 6a which reaches the inside of the semiconductor substrate 2 is made and the conductive via 6 is formed. Accordingly, it is comparatively easy to make the via hole 6a at a determined position. Furthermore, even if there is a slight deviation between a position at which the via hole 6a is made and the determined position, it is possible to form the multilayer interconnection 30 over it while correcting the positions of the conductive portions 30a (wirings and vias). Moreover, before the multilayer interconnection 30 is formed, the conductive via 6 is formed. This prevents the conductive via 6 from being connected to a conductive portion 30a (wiring or via) to which the conductive via 6 is not to be connected or from not being connected to a conductive portion 30a (wiring or via) to which the conductive via 6 is to be connected.

Furthermore, with the method according to the first embodiment the insulating film 10 is formed over the inside of the made via hole 6a. However, the insulating film 10 at the bottom of the via hole 6a is removed at the time of back grind performed later. This makes it possible to leave the insulating film 10 on a sidewall of the via hole 6a, that is to say, between the semiconductor substrate 2 and the barrier metal film 6b. Accordingly, there is no need to separately perform the step of removing the insulating film 10 at the bottom of the via hole 6a.

By the way, in addition to the above methods described in FIGS. 8A, 8B, 8C, and 8D and FIGS. 9A, 9B, 9C, and 9D, a method in which a conductive via is formed in advance in a semiconductor substrate used may be adopted as a method for forming a conductive via (TSV) which pierces a semiconductor substrate.

FIGS. 10A, 10B, 10C, and 10D illustrate still another example of a semiconductor device fabrication method.

Figure 10A:
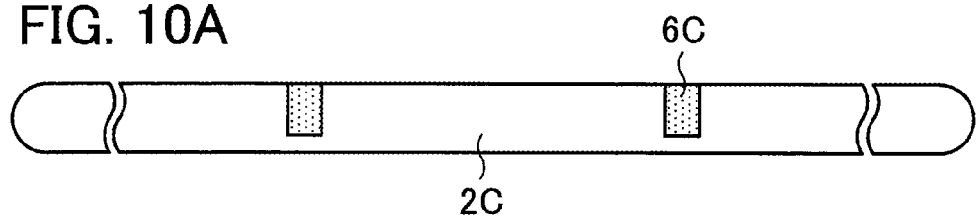
FIGS. 10A, 10B, 10O, and 10D illustrate still another example of a semiconductor device fabrication method.

As illustrated in FIG. 10A, a semiconductor substrate 2C in which a conductive via 6C is formed in advance is used. Polycrystalline silicon doped with impurities (doped polycrystalline silicon) is used for the conductive via 6C. If a metal material is used for the conductive via 6C, metal may adhere to the semiconductor substrate 2C and remain at the time of forming the conductive via 6C. Alternatively, metal may diffuse into the semiconductor substrate 2C at the time of forming the conductive via 6C. This may cause degradation in the performance of a transistor 20C formed later, a short circuit in a multilayer interconnection 30C, or the like.

Figure 10B:
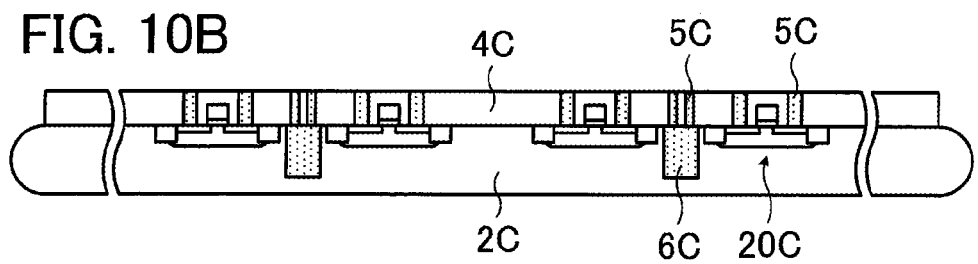
Figure 10C:
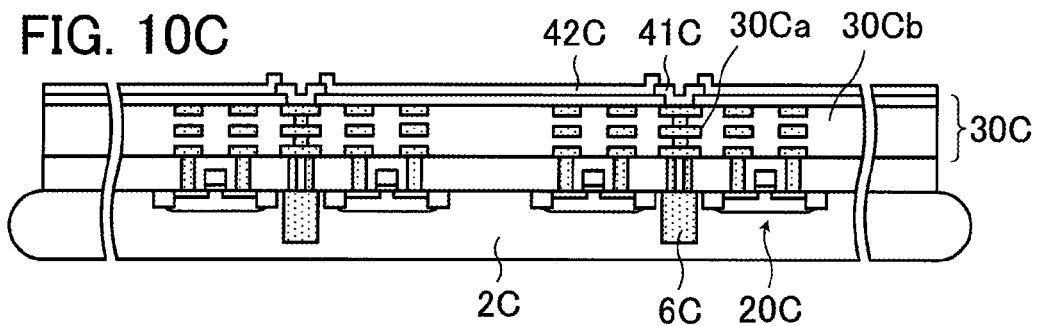

The semiconductor substrate 2C in which the above conductive via 6C is formed is used. As illustrated in FIG. 10B, the transistor 20C is formed, an insulating film 4c which covers the transistor 20C is formed, and conductive vias 50 connected to the transistor 20C and the conductive via 6C are formed.

After that, as illustrated in FIG. 10O, the multilayer interconnection 30C including conductive portions 30Ca and an insulating layer 30Cb is formed and a pad 41C and a cover film 42C are formed over the multilayer interconnection 30C.

Figure 10D:
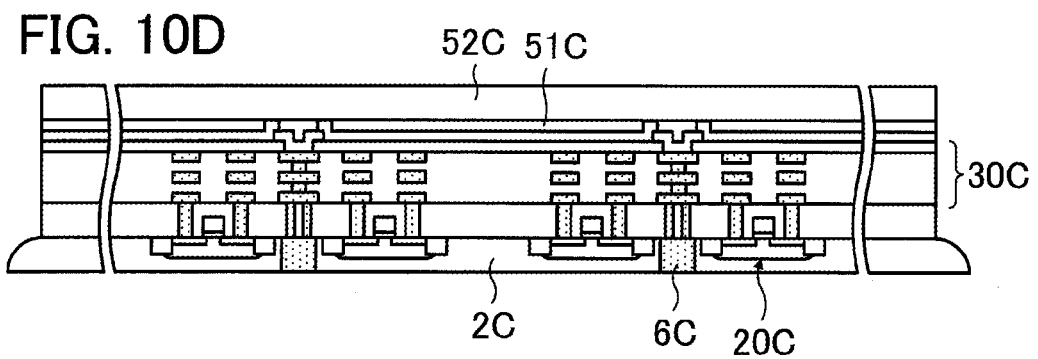

After that, as illustrated in FIG. 10D, back grind of the semiconductor substrate 2C is performed by the use of an adhesive 51C and a support board 52C so that the conductive via 6C of doped polycrystalline silicon will get exposed on a back of the semiconductor substrate 2C.

After that, the formation of a bump and the like over the back of the semiconductor substrate 2C and dicing are performed in the same way that is described in FIG. 1E.

With the method illustrated in FIGS. 10A, 10B, 10C, and 10D, the conductive via 6C formed is great in size (diameter and depth) and is great in volume. Therefore, when a semiconductor device is fabricated, it takes a long time to deposit doped polycrystalline silicon used for the conductive via 6C. In addition, the resistance of doped polycrystalline silicon is high compared with a metal material such as Cu. Accordingly, the resistance of the conductive via 6C is high.

With the method according to the above first embodiment for fabricating the semiconductor device 1, on the other hand, the conductive via 6 can be formed by the use of, for example, a metal material such as Cu. Furthermore, the conductive via 6 can be formed by the electrolytic plating process. As a result, the conductive via 6 can be formed in a short period of time compared with the above method in which doped polycrystalline silicon is deposited. Therefore, with the method according to the first embodiment the semiconductor device 1 including the low-resistance conductive via 6 can be fabricated efficiently.

As has been described in the foregoing, with the method according to the first embodiment the conductive via 6 for a TSV is formed before the multilayer interconnection 30 is formed. This makes it possible to fabricate the semiconductor device 1 including a TSV without complicating its fabrication process. In addition, the conductive via 6 for a TSV is formed before the multilayer interconnection 30 is formed. Accordingly, the multilayer interconnection 30 in which conductive vias and wirings are arranged at desired positions can be formed with accuracy. Furthermore, with the method according to the first embodiment a low-resistance TSV can efficiently be formed with accuracy.

A second embodiment will now be described.

Another example of the steps of forming the conductive vias 5 and 6 performed at the time of fabricating the above semiconductor device 1 will now be described as a second embodiment with reference to FIGS. 11A, 11B, and 11C through FIGS. 15A, 15B, and 15C. Of the steps of FIGS. 3A, 3B, and 3C through FIGS. 7A and 7B described in the above first embodiment, the step of FIG. 3A is also performed in a second embodiment. An example of steps performed after the step of FIG. 3A will now be described.

Figure 11A:
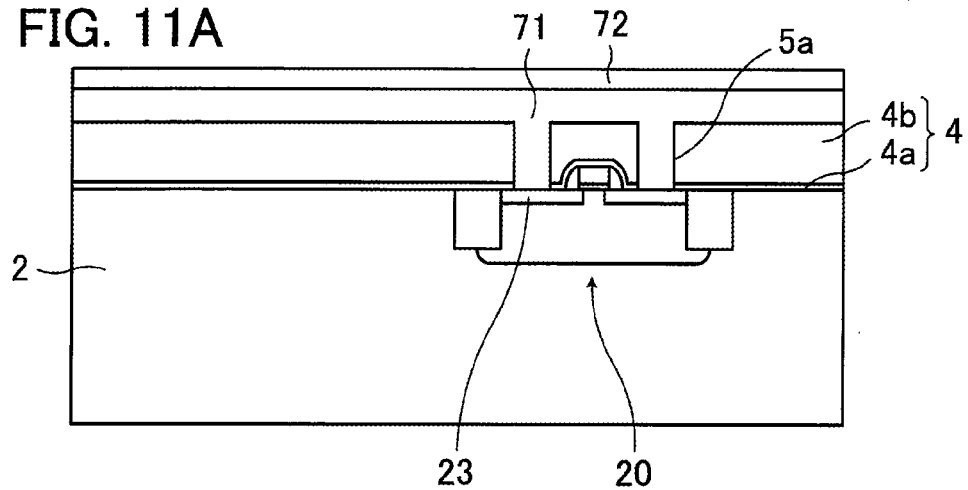
FIGS. 11A, 11B, and 11C are views for describing an example of a TSV via hole formation step in a second embodiment.
Figure 11B:
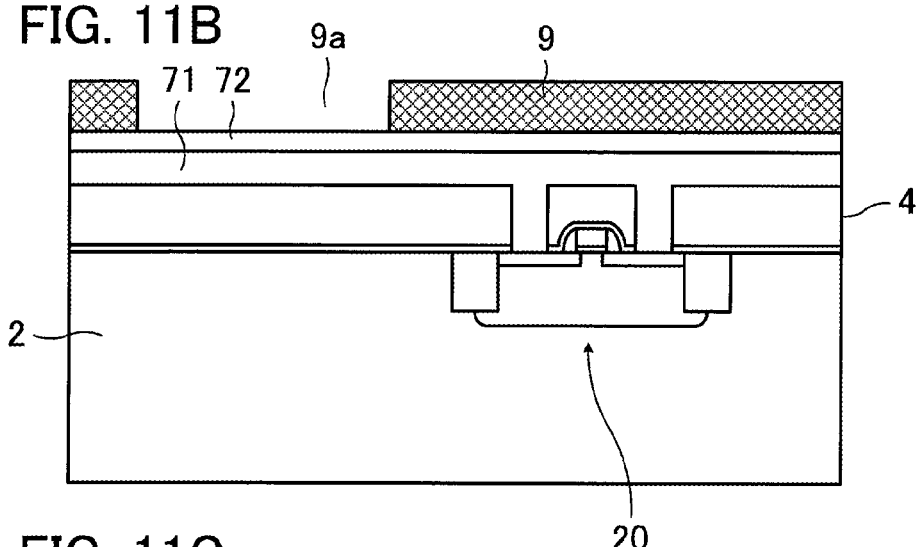
Figure 11C:
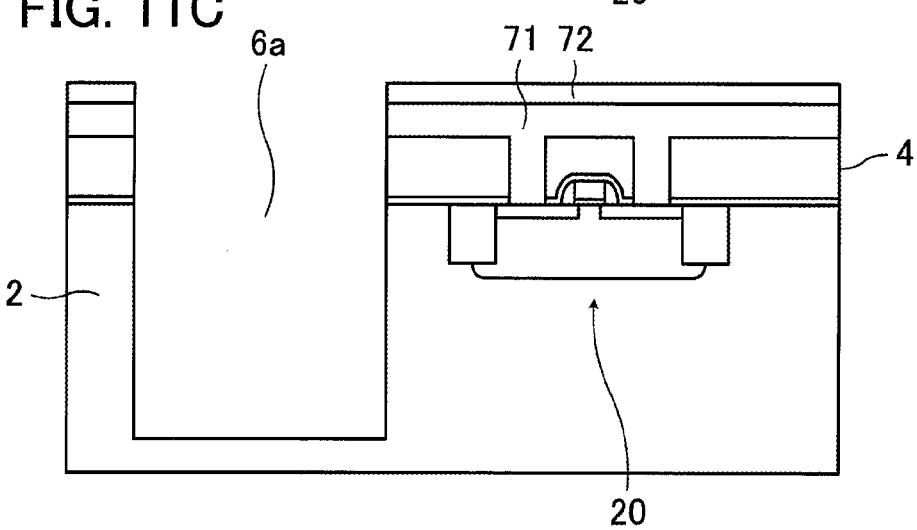

FIGS. 11A, 11B, and 11C are views for describing an example of a TSV via hole formation step in a second embodiment. FIG. 11A is a fragmentary schematic sectional view of a mask layer formation step. FIG. 11B is a fragmentary schematic sectional view of a resist pattern formation step. FIG. 11C is a fragmentary schematic sectional view of a TSV via hole formation step.

First, as illustrated in FIG. 3A, after a transistor 20 is formed in a semiconductor substrate 2, an insulating film 4 (insulating films 4a and 4b) which covers the transistor 20 is formed and via holes 5a which pierce the insulating film 4 and which reach impurity diffusion regions 23 (source and a drain) are formed.

After the formation of the via holes 5a in the second embodiment, as illustrated in FIG. 11A, a first mask layer 71 is formed and a second mask layer 72 is formed over it. For example, a resist film with a thickness of 300 to 400 nm is formed as the first mask layer 71. The first mask layer 71 is formed in the via holes 5a and over the insulating film 4 to fill in the via holes 5a with the first mask layer 71. The first mask layer 71 functions as a material used for filling in the via holes 5a. Furthermore, for example, a $SiO_2$ film with a thickness of 100 to 200 nm is formed as the second mask layer 72 by the CVD method using tetraethylorthosilicate (TEOS).

After the formation of the first mask layer 71 and the second mask layer 72, as illustrated in FIG. 11B, a resist pattern 9 having an opening 9a at a position at which a TSV is to be formed is formed over the second mask layer 72.

After the formation of the resist pattern 9, etching is performed with it as a mask. By doing so, as illustrated in FIG. 11C, a via hole 6a which pierces the second mask layer 72, the first mask layer 71, and the insulating film 4 and which reaches the inside of the semiconductor substrate 2 is formed.

To make the via hole 6a, first the second mask layer 72 is etched with the resist pattern 9 as a mask. If the second mask layer 72 is a $SiO_2$ film, then the second mask layer 72 is etched by the use of, for example, Ar and $C_4F_6$.

After the etching of the second mask layer 72, the first mask layer 71 is removed. If the first mask layer 71 is a resist film, then ashing of the first mask layer 71 is performed by the use of, for example, $O_2$ and nitrogen ($N_2$).

After the removal of the first mask layer 71, the insulating film 4 and the semiconductor substrate 2 are etched in order. If the insulating film 4 includes two layers, that is to say, a SiN film (insulating film 4a) and a $SiO_2$ film (insulating film 4b), then the $SiO_2$ film is etched by the use of, for example, Ar and $C_4F_6$ and the SiN film is etched by the use of, for example, Ar, $CH_2F_2$, and $O_2$. If the semiconductor substrate 2 is a Si substrate, then the semiconductor substrate 2 is etched by the use of, for example, $SF_6$ and $O_2$.

Figure 12A:
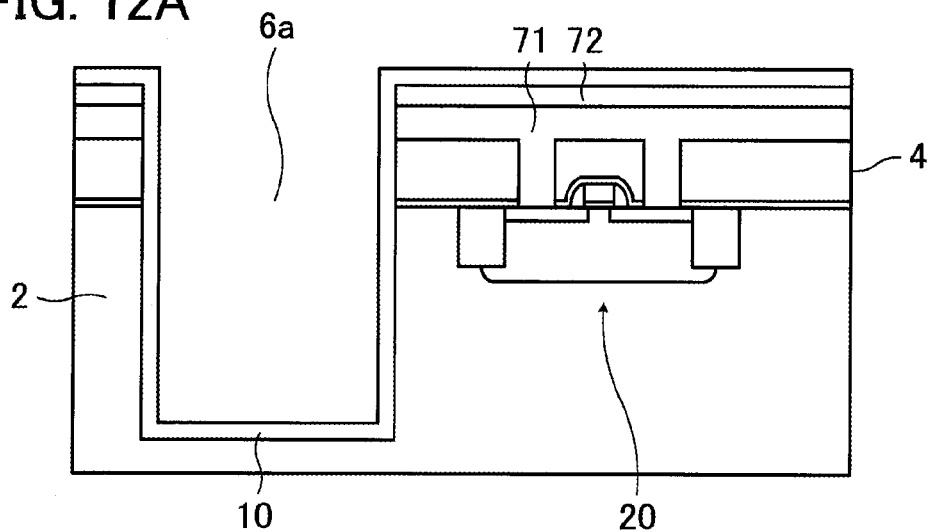
FIGS. 12A, 12B, and 12C are views for describing an example of an insulating film formation and mask layer removal step in the second embodiment.
Figure 12B:
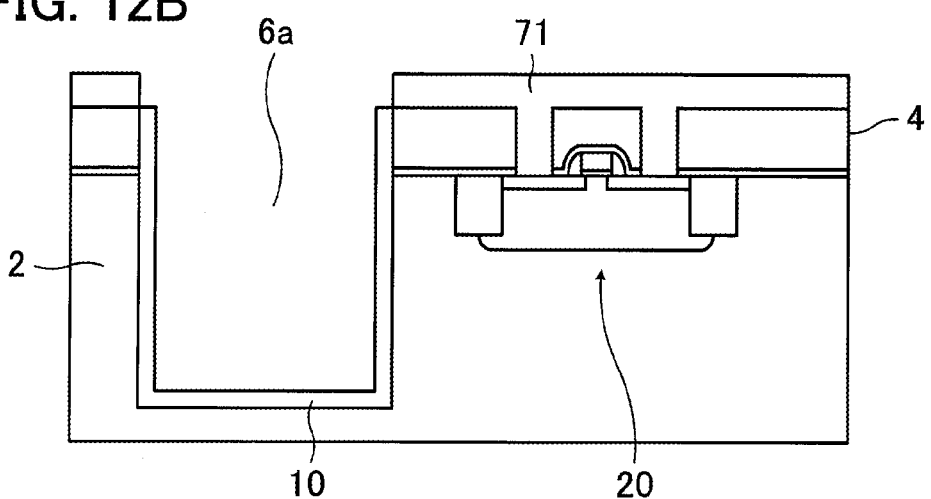
Figure 12C:
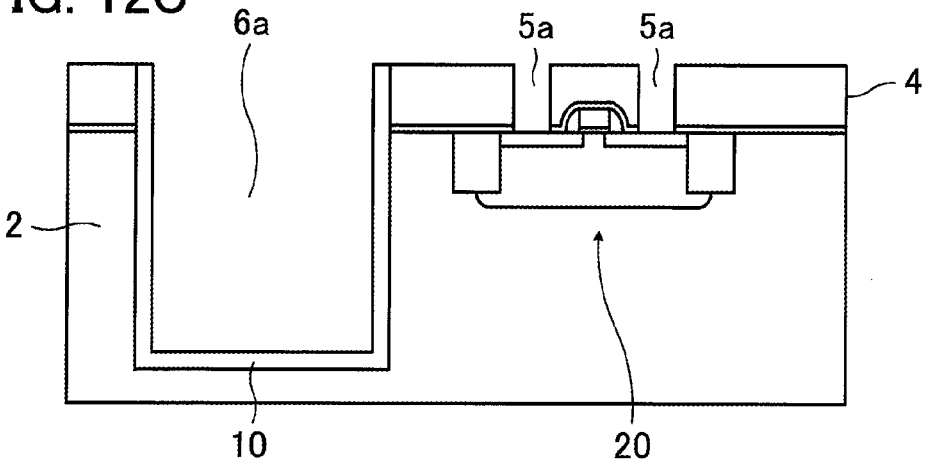

FIGS. 12A, 12B, and 12C are views for describing an example of an insulating film formation and mask layer removal step in the second embodiment. FIG. 12A is a fragmentary schematic sectional view of an insulating film formation step. FIG. 12B is a fragmentary schematic sectional view of an insulating film and second mask layer removal step. FIG. 12C is a fragmentary schematic sectional view of a first mask layer removal step.

After the formation of the via hole 6a, as illustrated in FIG. 12A, an insulating film 10 is formed over an inside of the via hole 6a and the second mask layer 72. For example, a SiN film with a thickness of 100 to 200 nm is formed as the insulating film 10.

After the formation of the insulating film 10, as illustrated in FIG. 12B, the second mask layer 72 and the insulating film 10 formed over it are removed.

At this time the insulating film 10 is etched (etched back) first and then the second mask layer 72 is etched (etched back). If the insulating film 10 is a SiN film, then the insulating film 10 is etched by the use of, for example, Ar, $CH_2F_2$, and $O_2$. If the second mask layer 72 is a $SiO_2$ film, then the second mask layer 72 is etched by the use of, for example, Ar and $C_4F_6$. The insulating film 10 of SiN can selectively be etched with respect to the second mask layer 72 of $SiO_2$. The second mask layer 72 of $SiO_2$ can selectively be etched with respect to the first mask layer 71 of resist.

FIG. 13 illustrates an example of a state after the etching of the second mask layer and the insulating film in the second embodiment. After the etching of the second mask layer 72 and the insulating film 10, for example, an edge portion of the insulating film 10 in the via hole 6a becomes roundish. In addition, the position of the edge portion of the insulating film 10 may be slightly lower than the position of an upper side of the insulating film 4.

When the insulating film 10 is etched, not only the insulating film 10 formed over the second mask layer 72 but also the insulating film 10 formed at the bottom of the via hole 6a may be removed. Furthermore, the insulating film 10 may remain at the bottom of the via hole 6a. Even if the insulating film 10 remains at the bottom of the via hole 6a, it can be removed at the time of back grind of the semiconductor substrate 2.

After the etching of the insulating film 10 and the second mask layer 72, as illustrated in FIG. 12C, the first mask layer 71 is removed. If the first mask layer 71 is a resist film, then the first mask layer 71 is removed by, for example, ashing.

A state in which the via hole 6a which pierces the insulating film 4, which reaches the inside of the semiconductor substrate 2, and on a sidewall of which the insulating film 10 is formed and the via holes 5a which pierce the insulating film 4 and which reach the transistor 20 are in one side of the semiconductor substrate 2 is obtained in this way.

Figure 14A:
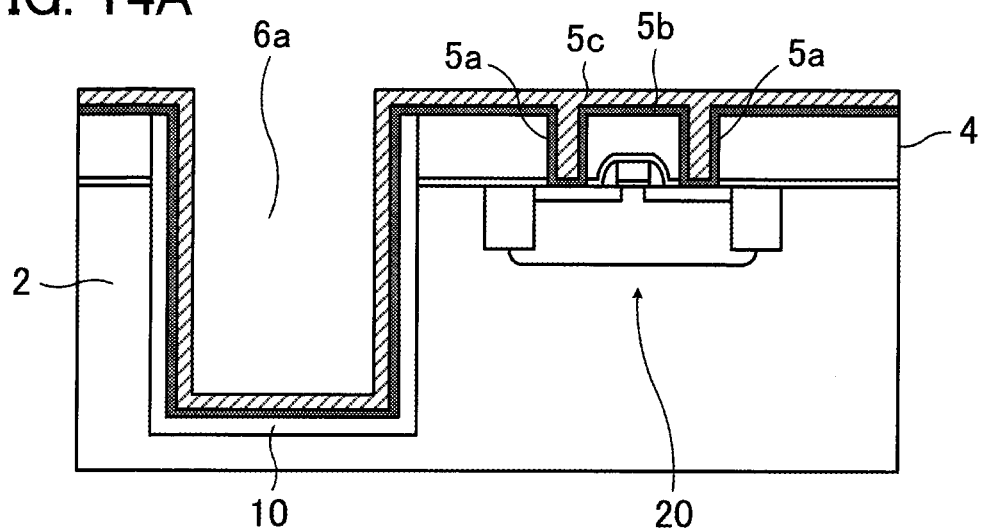
FIGS. 14A and 14B are views for describing an example of a via hole filling step in the second embodiment.
Figure 14B:
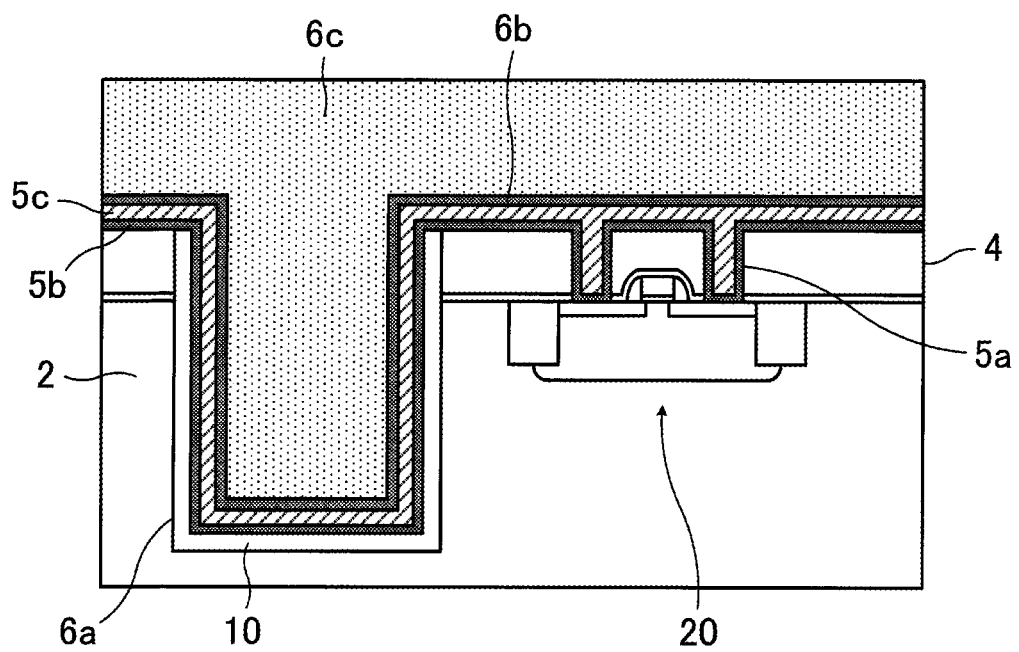

FIGS. 14A and 14B are views for describing an example of a via hole filling step in the second embodiment. FIG. 14A is a fragmentary schematic sectional view of a plug material formation step. FIG. 14B is a fragmentary schematic sectional view of a TSV material formation step.

After the steps to the removal of the first mask layer 71 are performed in the above way, a W layer (first conductive layer) 5c is formed as a plug material in the via holes 5a and 6a and over the insulating film 4 with a barrier metal film 5b between as illustrated in FIG. 14A. For example, a TiN film with a thickness of 5 to 20 nm is formed as the barrier metal film 5b. The thickness of the W layer 5c is, for example, 100 to 300 nm.

The barrier metal film 5b and the W layer 5c are formed so that the barrier metal film 5b is formed over insides of the via holes 5a which reach the transistor 20 and so that the via holes 5a in which the barrier metal film 5b is formed are filled in with the W layer 5c. At this time the barrier metal film 5b and the W layer 5c are formed not only in the via holes 5a and over the insulating film 4 but also over the insulating film 10 formed in the via hole 6a which reaches the inside of the semiconductor substrate 2.

After the formation of the barrier metal film 5b and the W layer 5c, as illustrated in FIG. 14B, a conductive layer (second conductive layer) 6c is formed as a TSV material over the W layer 5c formed in the via hole 6a and over the insulating film 4 with a barrier metal film 6b between.

The barrier metal film 6b with a thickness of 30 to 100 nm is formed by the use of, for example, Ti, Ta, TiN, or TaN. The conductive layer 6c is formed in the following way. For example, after a seed layer is formed, a Cu layer or a layer made mainly of Cu is formed by the electrolytic plating process so that the via hole 6a will be filled in with it.

As has been described, the via holes 5a are filled in with the barrier metal film 5b and the W layer 5c and the via hole 6a is filled in with the barrier metal film 5b, the W layer 5c, the barrier metal film 6b, and the conductive layer 6c.

Figure 15A:
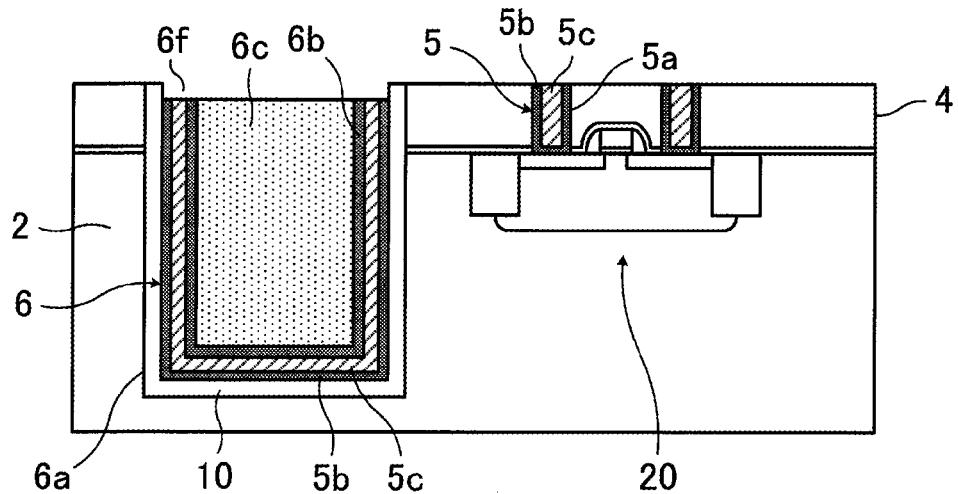
FIGS. 15A, 15B, and 15C are views for describing an example of a polishing and cap film formation step in the second embodiment.
Figure 15B:
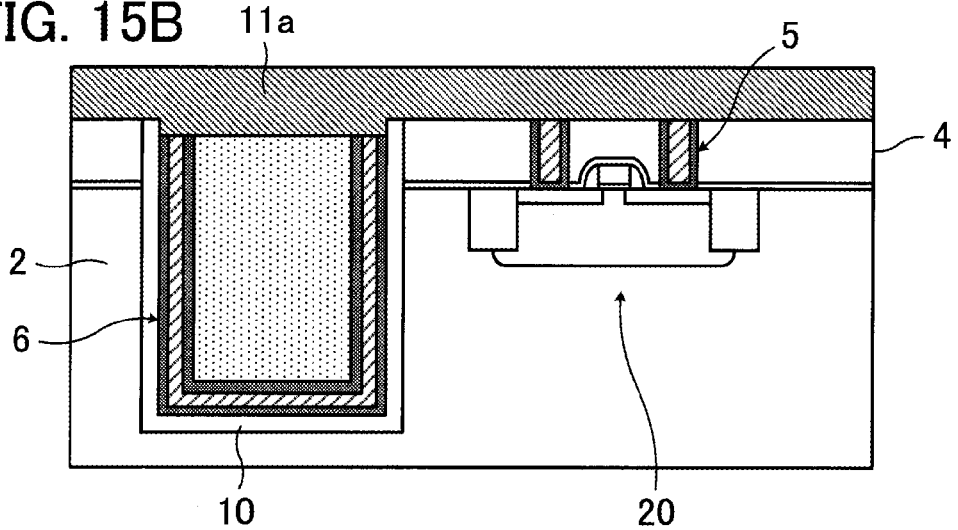
Figure 15C:
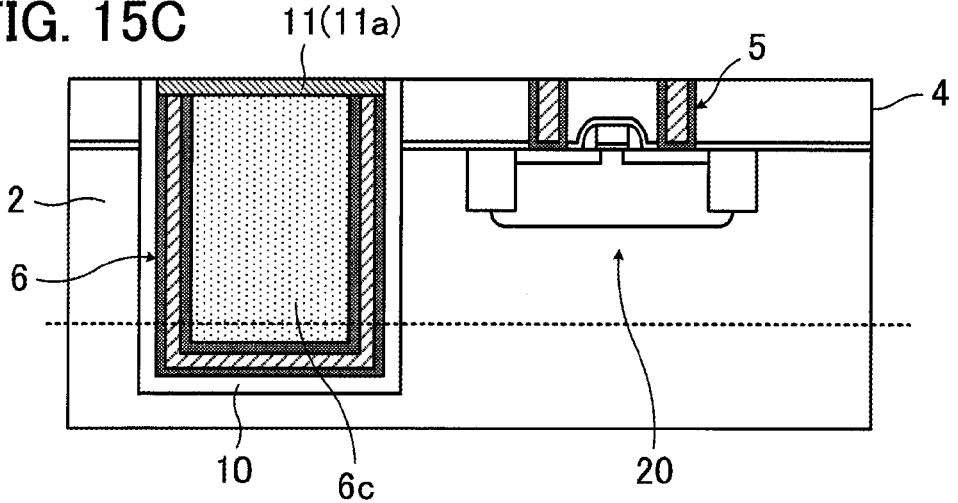

FIGS. 15A, 15B, and 15C are views for describing an example of a polishing and cap film formation step in the second embodiment. FIG. 15A is a fragmentary schematic sectional view of a TSV material and plug material polishing step. FIG. 15B is a fragmentary schematic sectional view of a cap film material formation step. FIG. 15C is a fragmentary schematic sectional view of a cap film material polishing step.

As illustrated in FIG. 15A, after the steps to the formation of the conductive layer 6c are performed, the conductive layer 6c and the barrier metal film 6b over the insulating film 4 are removed by polishing and the W layer 5c and the barrier metal film 5b are removed by polishing. In this case, the CMP may be performed. By performing this polishing, the W layer 5c is formed in the via holes 5a with the barrier metal film 5b between and conductive vias 5 are formed in the via holes 5a. Furthermore, the barrier metal film 5b, the W layer 5c, the barrier metal film 6b, and the conductive layer 6c are stacked in order in the via hole 6a and a conductive via 6 is formed in the via hole 6a. That is to say, the conductive vias 5 and 6 are completed at the same time at this polishing stage.

When polishing for forming the conductive vias 5 and 6 is performed in this way, a hollow 6f is made in the conductive via 6 having greater volume by, for example, utilizing dishing. This is the same with the above first embodiment.

As illustrated in FIG. 15B, after polishing is performed to form the conductive vias 5 and 6 and make the hollow 6f, a metal layer 11a (cap film material), such as a CoWP layer, for a metal cap film is formed in the hollow 6f and over the insulating film 4.

After the formation of the metal layer 11a, as illustrated in FIG. 15C, the metal layer 11a formed over the insulating film 4 is removed by polishing. The metal layer 11a can be polished by the CMP. After the metal layer 11a is polished, the metal layer 11a remains over a surface of the conductive via 6. As a result, a metal cap film 11 is formed.

After that, a cap film 33a and an interlayer dielectric 33b are formed and wirings 31a and 32a are formed. By doing so, a first wiring layer is formed. This is the same with FIGS. 7A and 7B described in the above first embodiment. Second and later wiring layers are formed in the same way and a multilayer interconnection 30 including a determined number of wiring layers is formed. After that, as illustrated in FIGS. 1C through 1E, a pad and a cover film 42 are formed, back grind of the semiconductor substrate 2 is performed so that the conductive via 6 will get exposed, and a bump 62 and the like are formed. After that, dicing is performed and individual semiconductor devices 1 are completed.

When the conductive via 6 formed in the above way gets exposed as a result of back grind, it is desirable from the viewpoint of the formation of a low-resistance TSV that a portion of the conductive layer 6c in the conductive via 6 made of Cu or made mainly of Cu get exposed on a back of the semiconductor substrate 2. That is to say, it is desirable to perform back grind to a position indicated by a dotted line in FIG. 15C for convenience.

With the method according to the second embodiment for fabricating the semiconductor device 1, as has been described in the foregoing, at the same time that the conductive vias 5 for plugs are completed, the conductive via 6 for a TSV is completed. After that, the multilayer interconnection 30 is formed.

With the method according to the second embodiment the conductive vias 5 for plugs and the conductive via 6 for a TSV are formed at the same time before the multilayer interconnection 30 is formed. This makes it possible to fabricate the semiconductor device 1 including a TSV without complicating its fabrication process. In addition, the conductive via 6 for a TSV is formed before the multilayer interconnection 30 is formed. This makes it possible to form with accuracy the multilayer interconnection 30 in which conductive vias and wirings are arranged at desired positions. Furthermore, with the method according to the second embodiment a low-resistance TSV can efficiently be formed with accuracy.

A third embodiment will now be described.

Still another example of the steps of forming the conductive vias 5 and 6 performed at the time of fabricating the above semiconductor device 1 will now be described as a third embodiment with reference to FIG. 16 and FIGS. 17A, 17B, and 17C. Of the steps of FIGS. 11A, 11B, and 11C through FIGS. 15A, 15B, and 15C described in the above second embodiment, the steps to the step of FIG. 12C are also performed in a third embodiment. An example of steps performed after the step of FIG. 12C will now be described.

Figure 16:
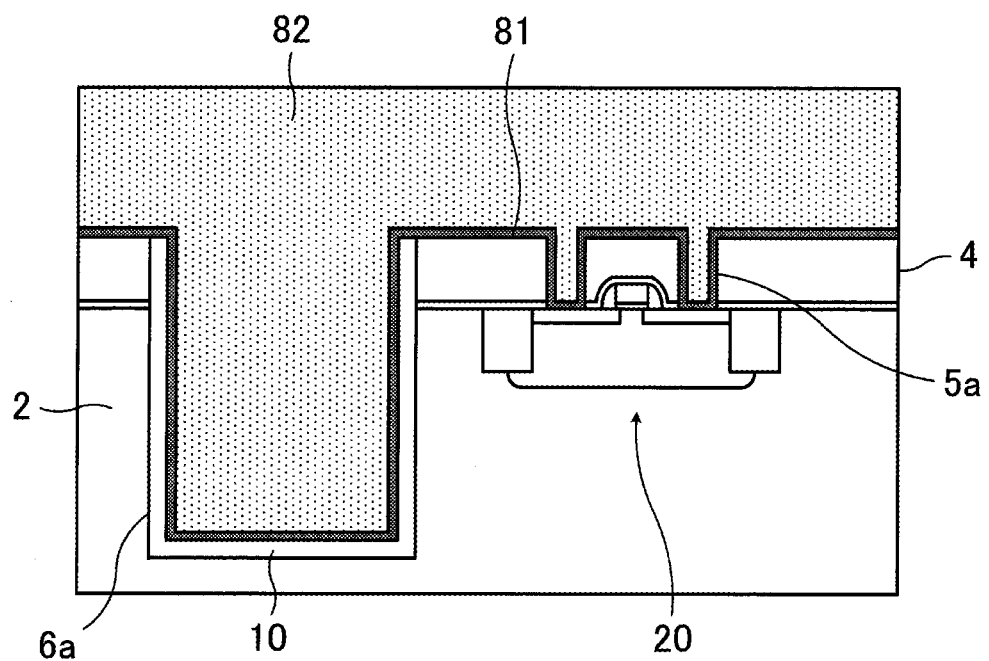
FIG. 16 is a view for describing an example of a via hole filling step in a third embodiment.

FIG. 16 is a view for describing an example of a via hole filling step in a third embodiment. FIG. 16 is a fragmentary schematic sectional view of a plug and TSV material formation step.

As illustrated in FIG. 12C, via holes 5a and 6a are made in one side of a semiconductor substrate 2. In the third embodiment, as illustrated in FIG. 16, a barrier metal film (barrier film) 81 and a conductive layer 82 are then formed both in the via holes 5a and in the via hole 6a as a plug and TSV material.

For example, a layer of one of Ti, Ta, TiN, and TaN or a lamination layer of two or more of them is formed as the barrier metal film 81 by the sputtering method, the CVD method, or the like. The thickness of the barrier metal film 81 is, for example, 5 to 20 nm. The barrier metal film 81 carries out the function of preventing an element from diffusing from the conductive layer 82. The barrier metal film 81 is formed under conditions under which it covers insides of the via holes 5a that reach a transistor 20. At this time the barrier metal film 81 is formed not only in the via holes 5a and over an insulating film 4 but also over an insulating film 10 formed in the via hole 6a which reaches the inside of the semiconductor substrate 2.

For example, a Cu layer or a layer made mainly of Cu is formed as the conductive layer 82 by the plating method. For example, the conductive layer 82 is formed by the plating method in the following way. A seed layer is formed over the barrier metal film 81 and the conductive layer 82 is formed by the electrolytic plating process by the use of the seed layer.

Both the via holes 5a and 6a are filled in with the barrier metal film 81 and the conductive layer 82 in this way.

Figure 17A:
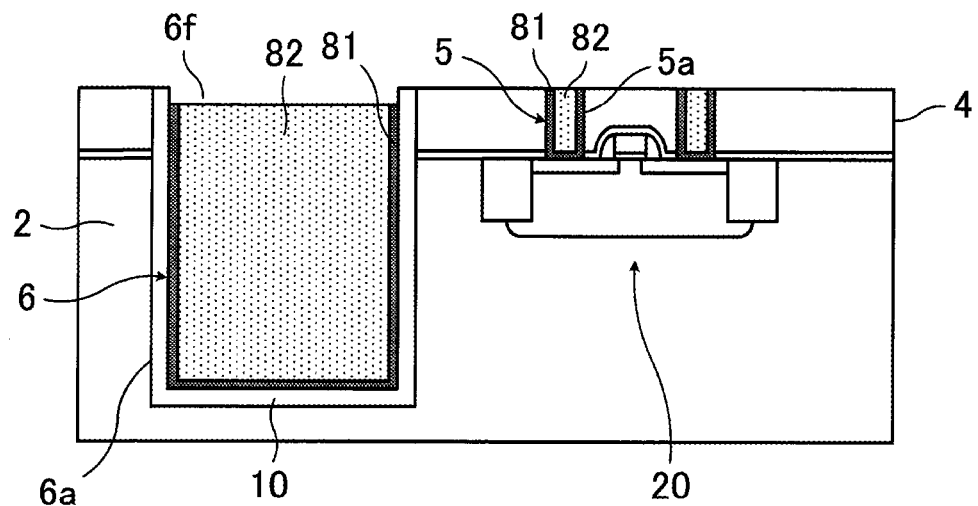
FIGS. 17A, 17B, and 17C are views for describing an example of a polishing and cap film formation step in the third embodiment.
Figure 17B:
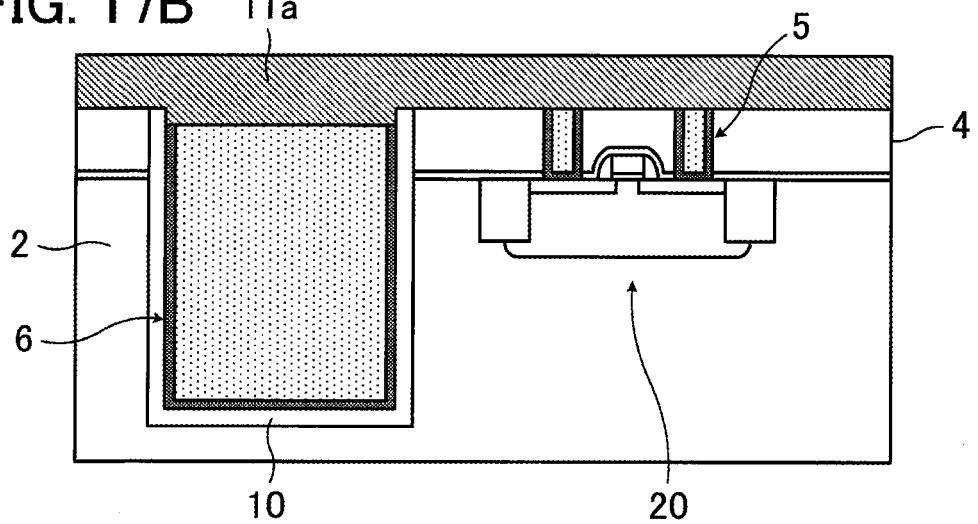
Figure 17C:
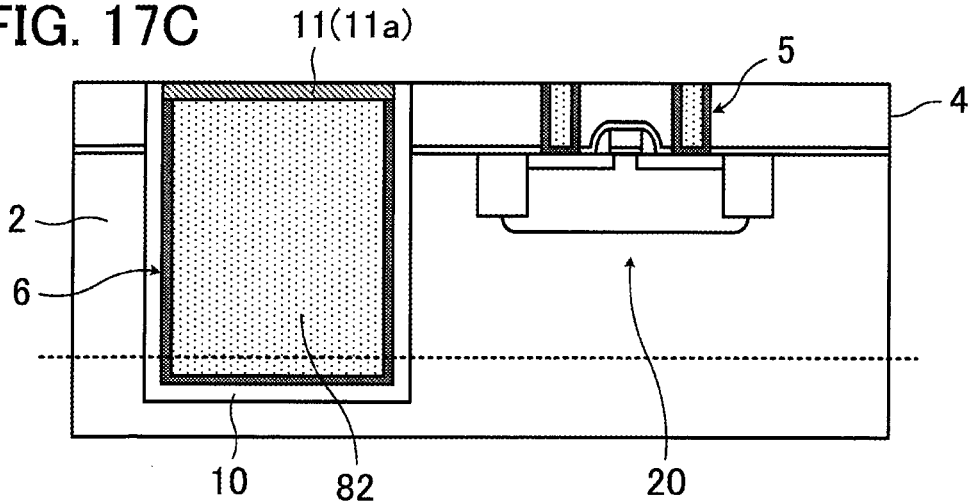

FIGS. 17A, 17B, and 17C are views for describing an example of a polishing and cap film formation step in the third embodiment. FIG. 17A is a fragmentary schematic sectional view of a plug and TSV material polishing step. FIG. 17B is a fragmentary schematic sectional view of a cap film material formation step. FIG. 17C is a fragmentary schematic sectional view of a cap film material polishing step.

After the formation of the barrier metal film 81 and the conductive layer 82, as illustrated in FIG. 17A, the conductive layer 82 and the barrier metal film 81 over the insulating film 4 are removed by polishing. In this case, the CMP may be performed. By performing this polishing, the conductive layer 82 is formed in the via holes 5a and 6a with the barrier metal film 81 between and conductive vias 5 and 6 are formed in the via holes 5a and 6a respectively. That is to say, the conductive vias 5 and 6 are completed at the same time at this polishing stage. Furthermore, the conductive vias 5 for plugs are formed by the use of the same material that is used for forming the conductive via 6 for a TSV. For example, both the conductive vias 5 and 6 can be formed by the use of Cu or a material which contains Cu.

When polishing for forming the conductive vias 5 and 6 is performed in this way, a hollow 6f is made in the conductive via 6 by, for example, utilizing dishing. As illustrated in FIG. 17B, after polishing is performed to form the conductive vias 5 and 6 and make the hollow 6f, a metal layer 11a (cap film material), such as a CoWP layer, for a metal cap film is formed in the hollow 6f and over the insulating film 4. After the formation of the metal layer 11a, as illustrated in FIG. 17C, the metal layer 11a over the insulating film 4 is removed by polishing. By doing so, a metal cap film 11 is formed over the conductive via 6.

After that, a cap film 33a and an interlayer dielectric 33b are formed and wirings 31a and 32a are formed. By doing so, a first wiring layer is formed. This is the same with FIGS. 7A and 7B described in the above first embodiment. Second and later wiring layers are formed in the same way and a multilayer interconnection 30 including a determined number of wiring layers is formed. After that, as illustrated in FIGS. 1C through 1E, a pad and a cover film 42 are formed, back grind of the semiconductor substrate 2 is performed so that the conductive via 6 will get exposed, and a bump 62 and the like are formed. After that, dicing is performed and individual semiconductor devices 1 are completed.

When the conductive via 6 formed in the above way gets exposed as a result of back grind, it is desirable from the viewpoint of the formation of a low-resistance TSV that a portion of the conductive layer 82 in the conductive via 6 made of Cu or made mainly of Cu get exposed on a back of the semiconductor substrate 2. That is to say, it is desirable to perform back grind to a position indicated by a dotted line in FIG. 17C for convenience.

With the method according to the third embodiment for fabricating the semiconductor device 1, as has been described in the foregoing, both the via holes 5a and 6a are filled in with the barrier metal film 81 and the conductive layer 82 and the conductive vias 5 and 6 are formed at the same time by polishing. After that, the multilayer interconnection 30 is formed.

With the method according to the third embodiment the conductive vias 5 for plugs and the conductive via 6 for a TSV can be formed by the use of the same material. For example, by forming both the conductive vias 5 and 6 by the use of a low-resistance material such as Cu, the low-resistance conductive vias 5 and 6 can be obtained. The resistance of the conductive vias 5 for plugs can be reduced compared with a case where W is used. Furthermore, in the third embodiment, too, the conductive via 6 for a TSV is formed before the formation of the multilayer interconnection 30. Therefore, the same effects that are obtained in the above first and second embodiments can be achieved.

A fourth embodiment will now be described.

FIGS. 18A, 18B, 18C, 18D, and 18E illustrate an example of a semiconductor device fabrication method according to a fourth embodiment.

Figure 18A:
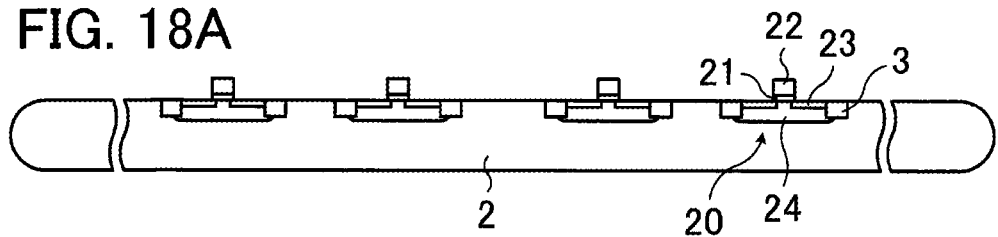
FIGS. 18A, 18B, 18C, 18D, and 18E illustrate an example of a semiconductor device fabrication method according to a fourth embodiment.

First, as illustrated in FIG. 18A, a semiconductor substrate 2, such as a Si substrate, in which isolation regions 3 are formed by the STI method or the like is prepared and a transistor 20 is formed in an element region defined by the isolation regions 3.

Figure 18B:
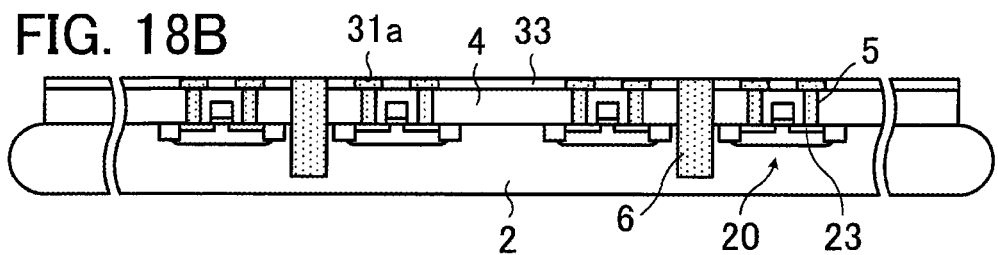

After the formation of the transistor 20, as illustrated in FIG. 18B, an insulating film 4 which covers the transistor 20 is formed and conductive vias (plugs) 5 which pierce the insulating film 4 and which reach impurity diffusion regions 23 of the transistor 20 are formed. In addition, an insulating film 33 is formed over the insulating film 4. Wirings 31a which pierce the insulating film 33 and which reach the conductive vias 5, which are plugs, and a conductive via 6 which pierces the insulating film 33 and the insulating film 4 and which reaches the inside of the semiconductor substrate 2 are formed. The insulating film 33 and the wirings 31a form a part of a multilayer interconnection 30.

Figure 18C:
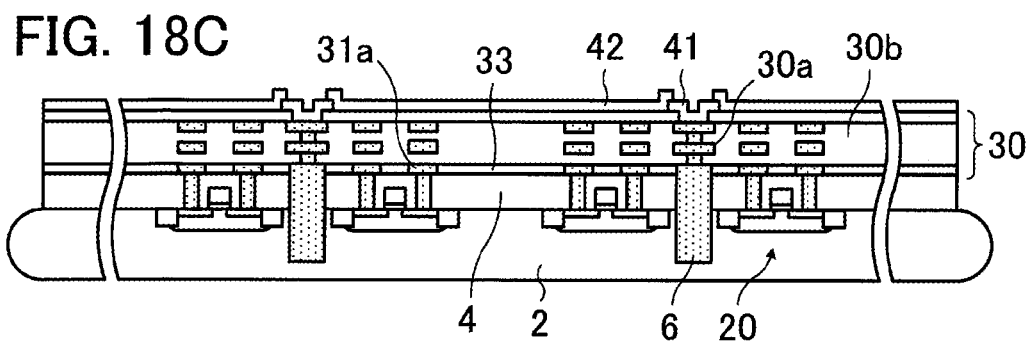

After the formation of the wirings 31a and the conductive via 6, as illustrated in FIG. 18C, the multilayer interconnection 30 including conductive portions 30a electrically connected to the wirings 31a and the conductive via 6 and an insulating layer 30b is formed. A pad 41 and a cover film 42 are formed over the multilayer interconnection 30. FIG. 18C illustrates a pad electrically connected to the conductive via 6 which reaches the inside of the semiconductor substrate 2.

Figure 18D:
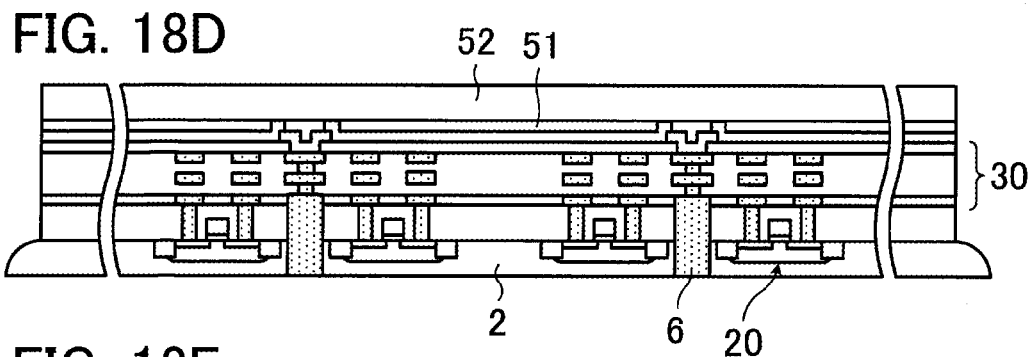

After the formation of the multilayer interconnection 30, as illustrated in FIG. 18D, a support board 52 is stuck on a side on which the multilayer interconnection 30 is formed by the use of an adhesive 51. A back of the semiconductor substrate 2 (side opposite to the side on which the support board 52 is stuck) is then ground so that the conductive via 6 formed in the semiconductor substrate 2 will get exposed. By doing so, a TSV is obtained.

Figure 18E:
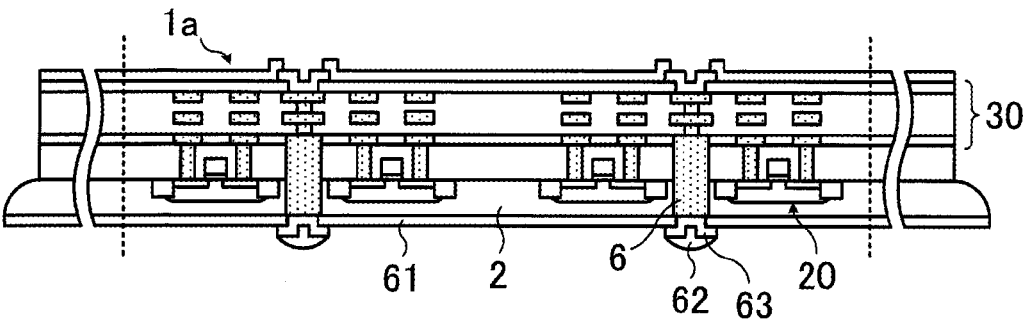

After the back grind, as illustrated in FIG. 18E, an insulating film 61 is formed over the back of the semiconductor substrate 2, an adherent conductive layer 63 and a bump 62 are formed over the conductive via 6 which gets exposed on the back, and the adhesive 51 and the support board 52 on a front of the semiconductor substrate are removed. After that, dicing is performed, for example, at positions indicated by dotted lines in FIG. 18E to cut a wafer into individual semiconductor devices 1a.

The step of forming the wirings 31a and the conductive via 6 and the subsequent steps which are performed for fabricating the above semiconductor device 1a will now be described in further detail with reference to FIGS. 19A, 19B, and 19C through FIG. 25. Of the steps of FIGS. 3A, 3B, and 3C through FIGS. 7A and 7B described in the above first embodiment, the steps to the step of FIG. 3C are also performed in the fourth embodiment. An example of steps performed after the step of FIG. 3C will now be described.

FIGS. 19A, 19B, and 19C are views for describing an example of a wiring groove formation step in the fourth embodiment. FIG. 19A is a fragmentary schematic sectional view after the formation of plugs. FIG. 19B is a fragmentary schematic sectional view of a cap film and interlayer dielectric formation step. FIG. 19C is a fragmentary schematic sectional view of a wiring groove formation step.

In the fourth embodiment, as illustrated in FIG. 19A, the conductive vias 5 for plugs are formed first (FIG. 3C). This is the same with the above first embodiment. After the formation of the conductive vias 5, as illustrated in FIG. 19B, an insulating cap film 33a is formed and an interlayer dielectric 33b is formed over the cap film 33a. The insulating cap film 33a and the interlayer dielectric 33b are formed as the above insulating layer 33. For example, a SiC film with a thickness of 30 to 100 nm is formed as the cap film 33a. For example, a $SiO_2$ film or the like with a thickness of 100 to 400 nm is formed as the interlayer dielectric 33b.

After the formation of the cap film 33a and the interlayer dielectric 33b, as illustrated in FIG. 19C, wiring grooves 31d are cut. The wiring grooves 31d can be cut by photolithography and etching. That is to say, first a resist pattern in which openings are formed at positions where the wiring grooves 31d are to be cut is formed over the interlayer dielectric 33b and then the interlayer dielectric 33b and the cap film 33a are etched with the resist pattern as a mask. By doing so, the wiring grooves 31d are cut.

Figure 20A:
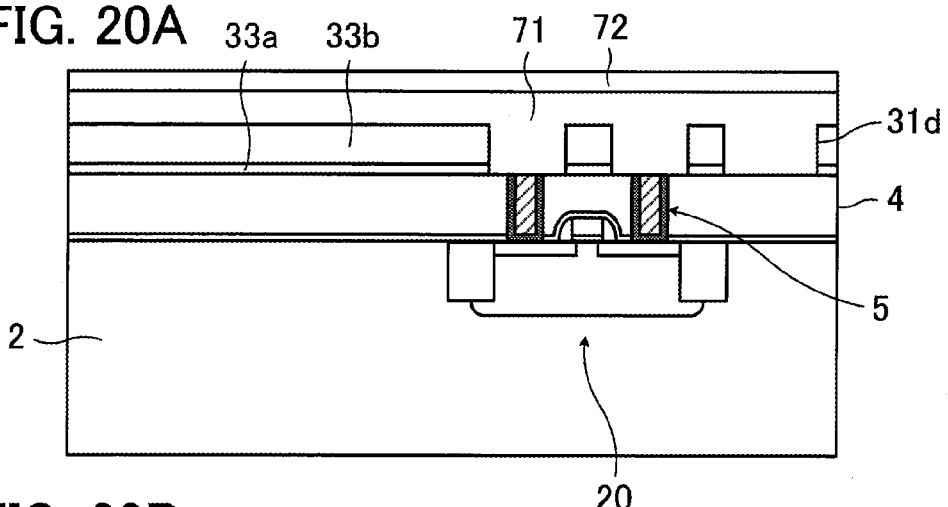
FIGS. 20A, 20B, and 20C are views for describing an example of a via hole making step in the fourth embodiment.
Figure 20B:
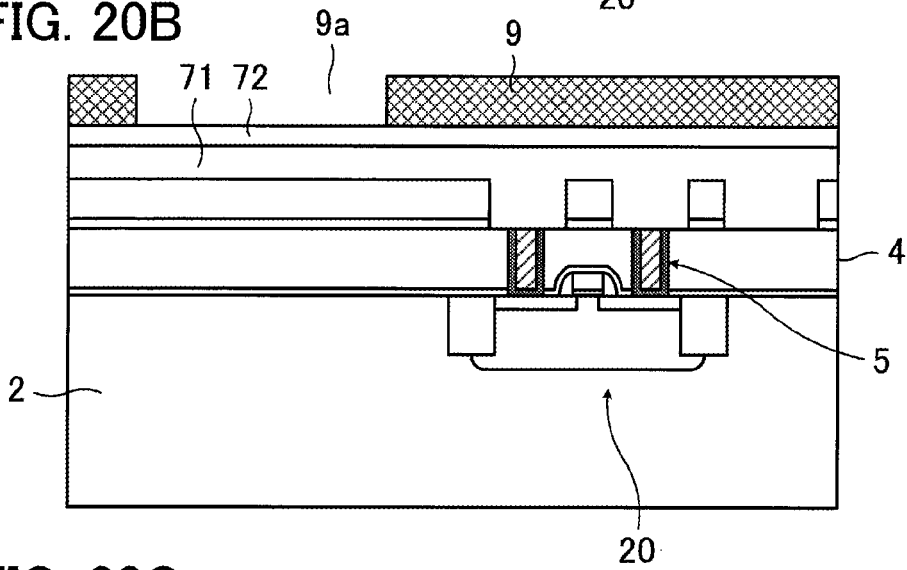
Figure 20C:
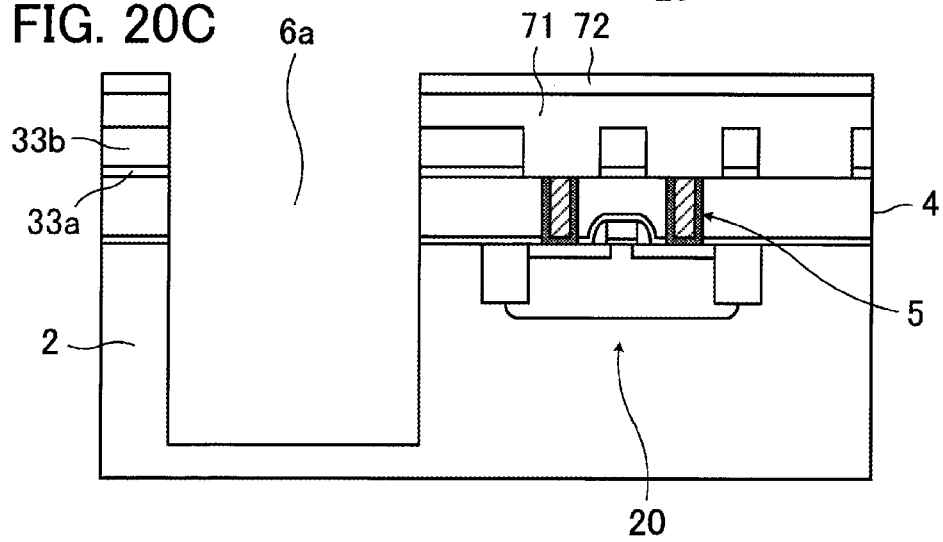

FIGS. 20A, 20B, and 20C are views for describing an example of a via hole making step in the fourth embodiment. FIG. 20A is a fragmentary schematic sectional view of a mask layer formation step. FIG. 20B is a fragmentary schematic sectional view of a resist pattern formation step. FIG. 20C is a fragmentary schematic sectional view of a via hole making step.

After the formation of the wiring grooves 31d, as illustrated in FIG. 20A, a first mask layer 71 is formed and a second mask layer 72 is formed over it. For example, a resist film with a thickness of 300 to 400 nm is formed as the first mask layer 71. The first mask layer is formed in the wiring grooves 31d and over the interlayer dielectric 33b to fill in the wiring grooves 31d with the first mask layer 71. The first mask layer 71 functions as a material used for filling in the wiring grooves 31d. Furthermore, for example, a $SiO_2$ film with a thickness of 100 to 200 nm is formed as the second mask layer 72 by the CVD method using TEOS.

After the formation of the first mask layer 71 and the second mask layer 72, as illustrated in FIG. 20B, a resist pattern 9 having an opening 9a at a position at which a TSV is to be formed is formed over the second mask layer 72.

After the formation of the resist pattern 9, etching is performed with it as a mask. By doing so, as illustrated in FIG. 20C, a via hole 6a which pierces the second mask layer 72, the first mask layer 71, the interlayer dielectric 33b, the cap film 33a, and the insulating film 4 and which reaches the inside of the semiconductor substrate 2 is formed. For example, to make the via hole 6a, the second mask layer 72, the first mask layer 71, the interlayer dielectric 33b, the cap film 33a, the insulating film 4, and the semiconductor substrate 2 can selectively be etched in order.

Figure 21A:
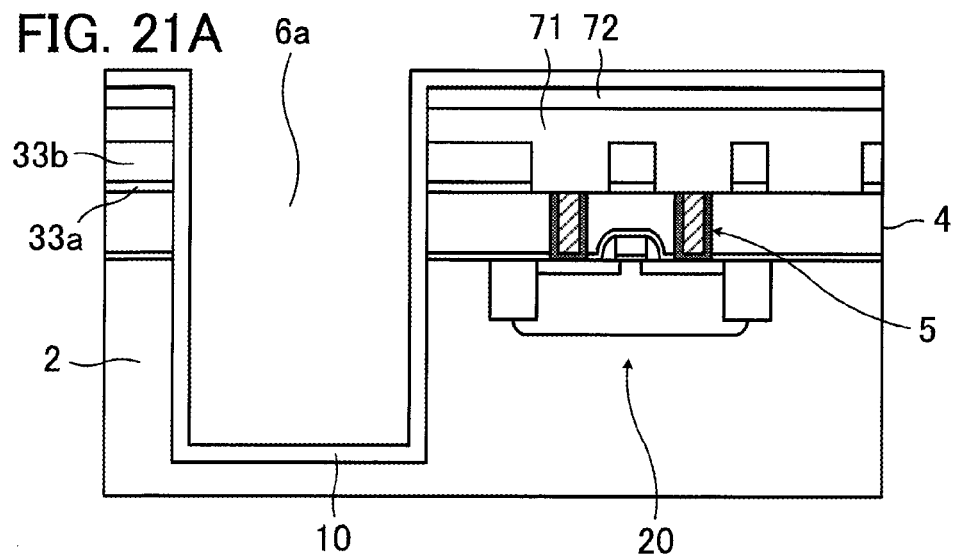
FIGS. 21A, 21B, and 21C are views for describing an example of an insulating film formation and mask layer removal step in the fourth embodiment.
Figure 21B:
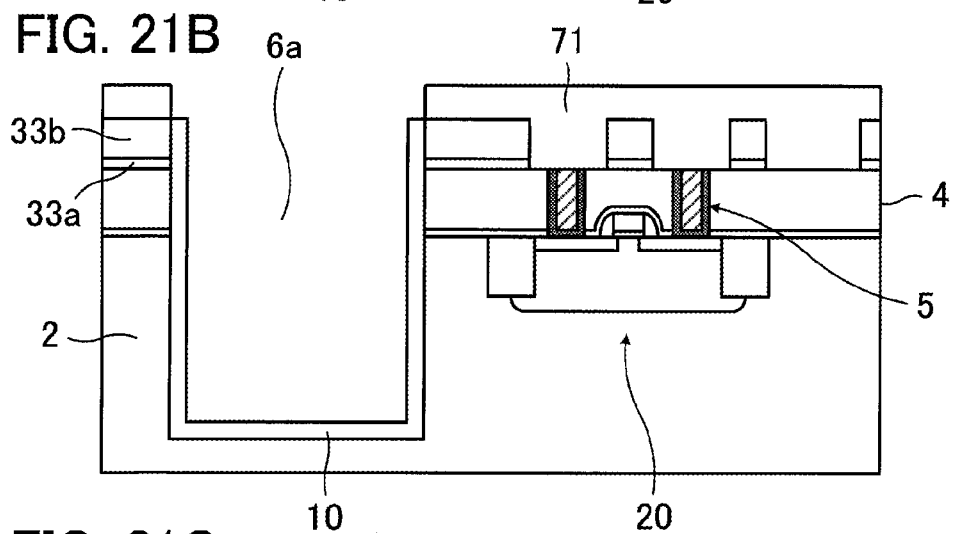
Figure 21C:
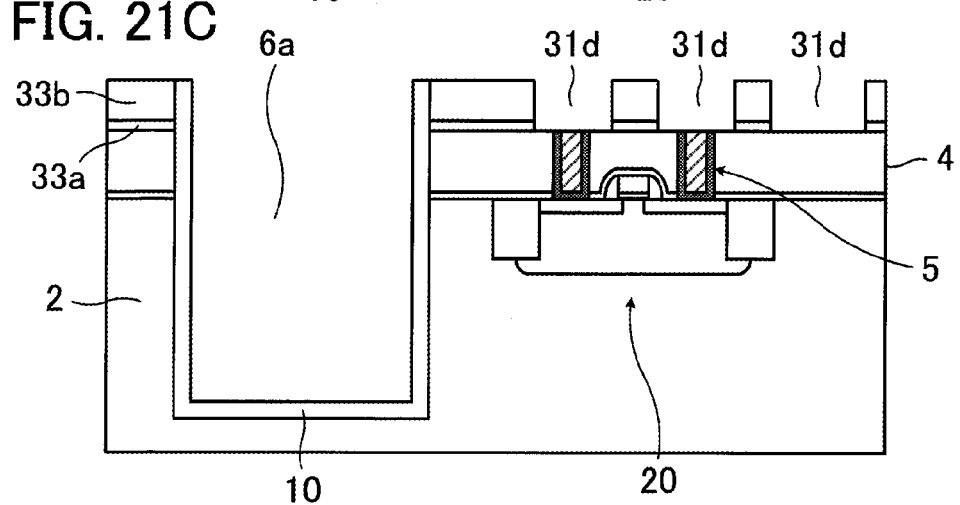

FIGS. 21A, 21B, and 21C are views for describing an example of an insulating film formation and mask layer removal step in the fourth embodiment. FIG. 21A is a fragmentary schematic sectional view of an insulating film formation step. FIG. 21B is a fragmentary schematic sectional view of an insulating film and second mask layer removal step. FIG. 21C is a fragmentary schematic sectional view of a first mask layer removal step.

After the making of the via hole 6a, as illustrated in FIG. 21A, an insulating film 10 is formed over an inside of the via hole 6a and the second mask layer 72. For example, a SiN film with a thickness of 100 to 200 nm is formed as the insulating film 10.

After the formation of the insulating film 10, as illustrated in FIG. 21B, the second mask layer 72 and the insulating film 10 formed over it are removed. At this time the insulating film 10 is etched (etched back) first and then the second mask layer 72 is etched (etched back). This is the same with FIGS. 12B and 13. For example, the insulating film 10 and the second mask layer 72 can selectively be etched in order.

After the etching of the insulating film 10 and the second mask layer 72, as illustrated in FIG. 21C, the first mask layer 71 is removed. For example, the first mask layer 71 which is a resist film can be removed by ashing.

A state in which the wiring grooves 31d and the via hole 6a are in one side of the semiconductor substrate 2 is obtained in this way.

Figure 22:
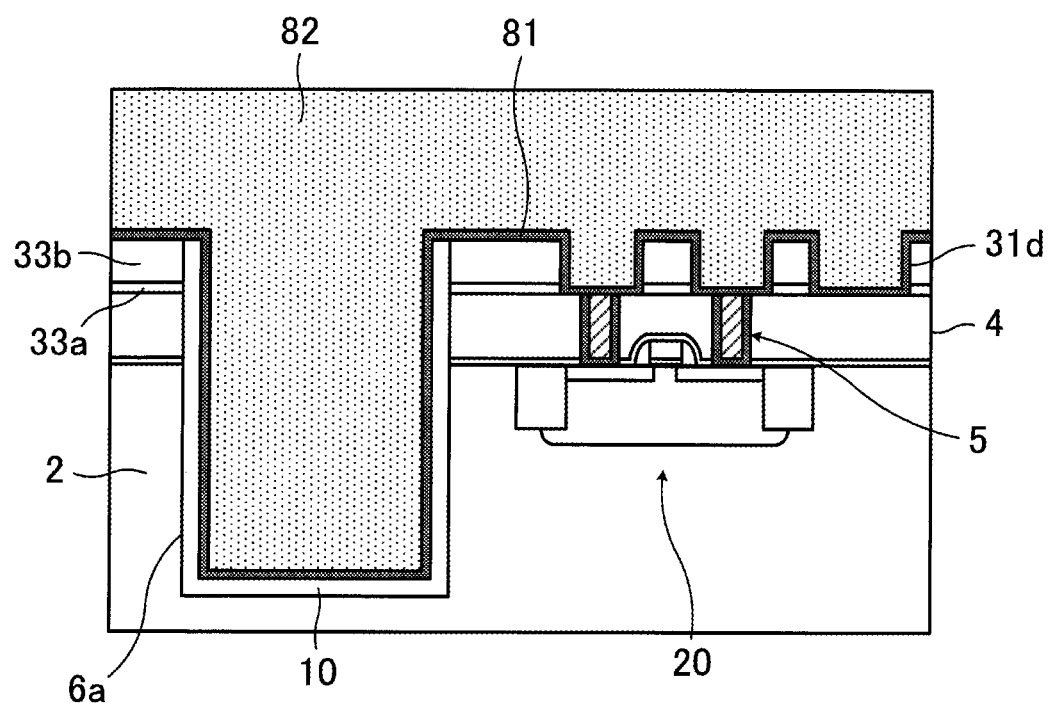
FIG. 22 is a view for describing an example of a via hole filling step in the fourth embodiment.

FIG. 22 is a view for describing an example of a via hole filling step in the fourth embodiment. FIG. 22 is a fragmentary schematic sectional view of a wiring and TSV material formation step.

As illustrated in FIG. 22, a barrier metal film 81 and a conductive layer 82 are formed both in the wiring grooves 31d and in the via hole 6a as a wiring and TSV material after the wiring grooves 31d and the via hole 6a are cut in the above way in one side of the semiconductor substrate 2.

For example, a layer of one of Ti, Ta, TiN, and TaN or a lamination layer of two or more of them is formed as the barrier metal film 81 so that it will cover insides of the wiring grooves 31d. The thickness of the barrier metal film 81 is 5 to 20 nm. At this time the barrier metal film 81 is formed not only in the wiring grooves 31d and over the interlayer dielectric 33b but also over the insulating film 10 formed in the via hole 6a which reaches the inside of the semiconductor substrate 2.

For example, a Cu layer or a layer made mainly of Cu is formed as the conductive layer 82 by the plating method. For example, the conductive layer 82 is formed by the plating method in the following way. A seed layer is formed over the barrier metal film 81 and the conductive layer 82 is formed by the electrolytic plating process by the use of the seed layer.

Both the wiring grooves 31d and the via hole 6a are filled in with the barrier metal film 81 and the conductive layer 82 in this way.

Figure 23A:
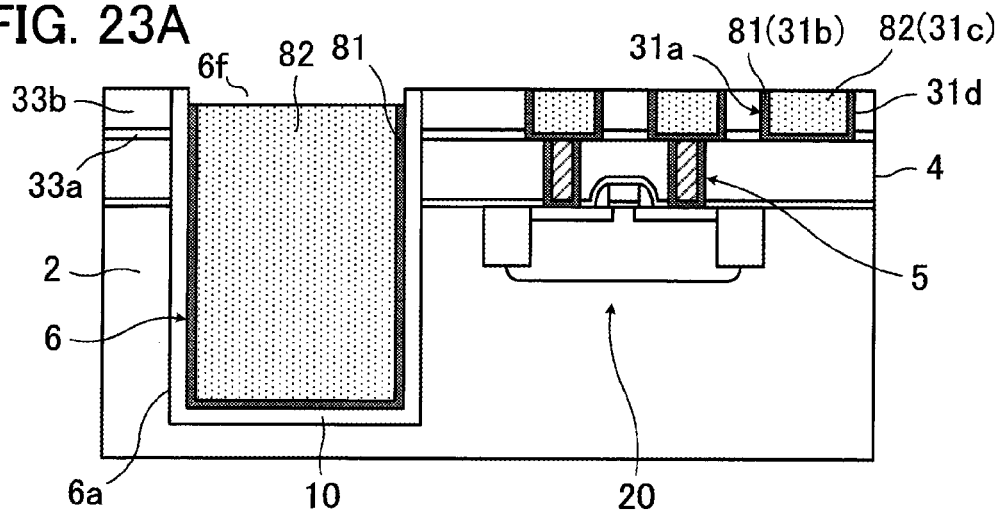
FIGS. 23A, 23B, and 23C are views for describing an example of a polishing and cap film formation step in the fourth embodiment.
Figure 23B:
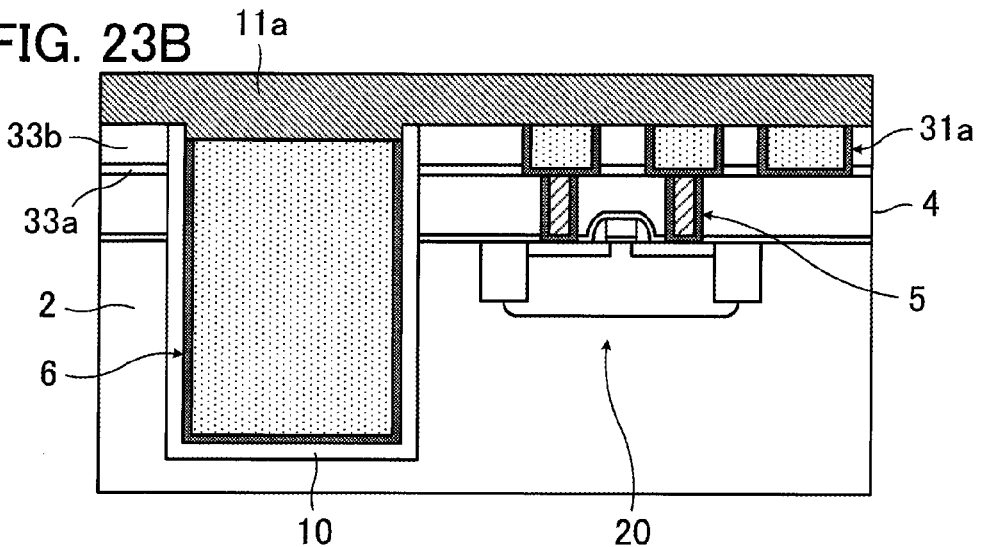
Figure 23C:
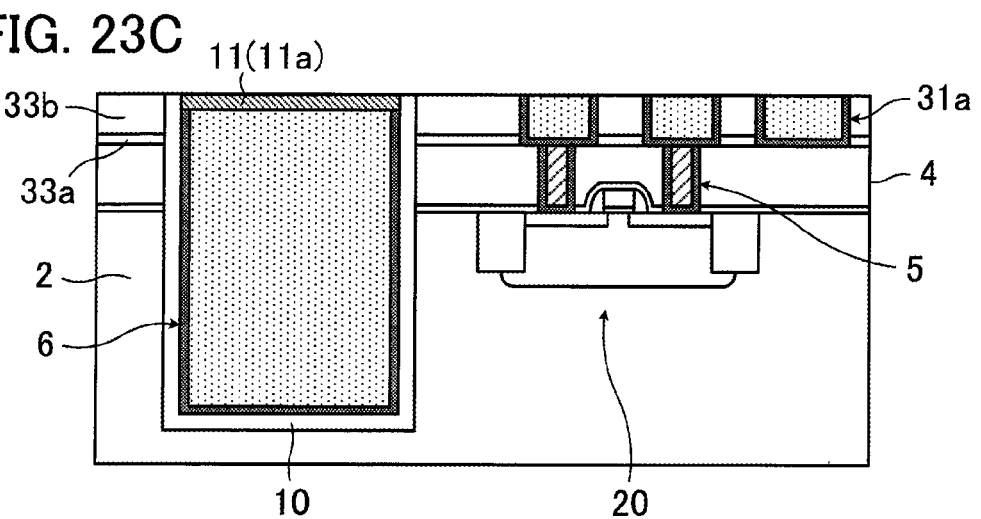

FIGS. 23A, 23B, and 23C are views for describing an example of a polishing and cap film formation step in the fourth embodiment. FIG. 23A is a fragmentary schematic sectional view of a wiring and TSV material polishing step. FIG. 23B is a fragmentary schematic sectional view of a cap film material formation step. FIG. 23C is a fragmentary schematic sectional view of a cap film material polishing step.

After the formation of the barrier metal film 81 and the conductive layer 82, the conductive layer 82 and the barrier metal film 81 over the interlayer dielectric 33b are removed by polishing. In this case, the CMP may be performed. By performing this polishing, as illustrated in FIG. 23A, the wiring grooves 31*d* are filled in with the conductive layer 82 (31*c*) with the barrier metal film 81 (31*b*) between and the wirings 31*a* are formed in the wiring grooves 31*d*. Furthermore, the via hole 6*a* is filled in with the conductive layer 82 with the barrier metal film 81 between and the conductive via 6 is formed in the via hole 6*a*. The wirings 31*a* and the conductive via 6 for a TSV are formed in this way at the same time by the use of the same material and can be formed by the use of, for example, Cu or a material which contains Cu.

When polishing for forming the wirings 31*a* and the conductive via 6 is performed, a hollow 6*f* is made in the conductive via 6 by, for example, utilizing dishing. As illustrated in FIG. 23B, after polishing is performed to form the conductive via 6 and make the hollow 6*f*, a metal layer 11*a* (cap film material), such as a CoWP layer, for a metal cap film is formed in the hollow 6*f* and over the interlayer dielectric 33*b*.

After the formation of the metal layer 11*a*, as illustrated in FIG. 23C, the metal layer 11*a* over the interlayer dielectric 33*b* is removed by polishing. By doing so, a metal cap film 11 is formed over the conductive via 6.

Hollows may be made not only in the conductive via 6 but also in the wirings 31*a* at the time of polishing the barrier metal film 81 and the conductive layer 82. In this case, the metal cap film 11 is formed over the wirings 31*a* by polishing after the formation of the metal layer 11*a*.

In the fourth embodiment the conductive via 6 which reaches the inside of the semiconductor substrate 2 and the cap film 33*a*, the interlayer dielectric 33*b*, and the wirings 31*a* included in a first wiring layer of the multilayer interconnection 30 have been formed by the above steps.

After that, second and later wiring layers of the multilayer interconnection 30 are formed.

Figure 24A:
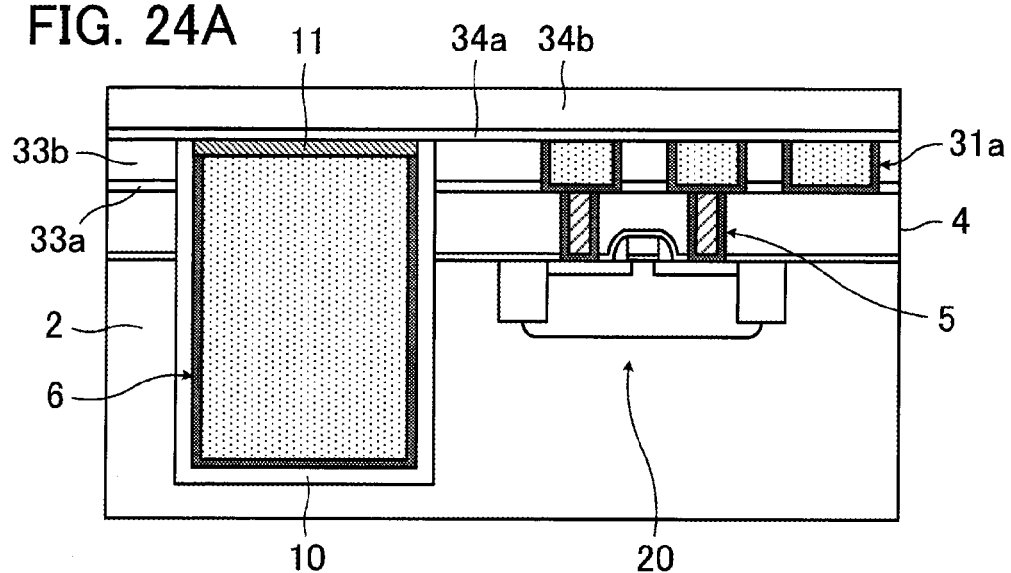
FIGS. 24A and 24B are views for describing an example of a wiring layer formation step in the fourth embodiment.
Figure 24B:
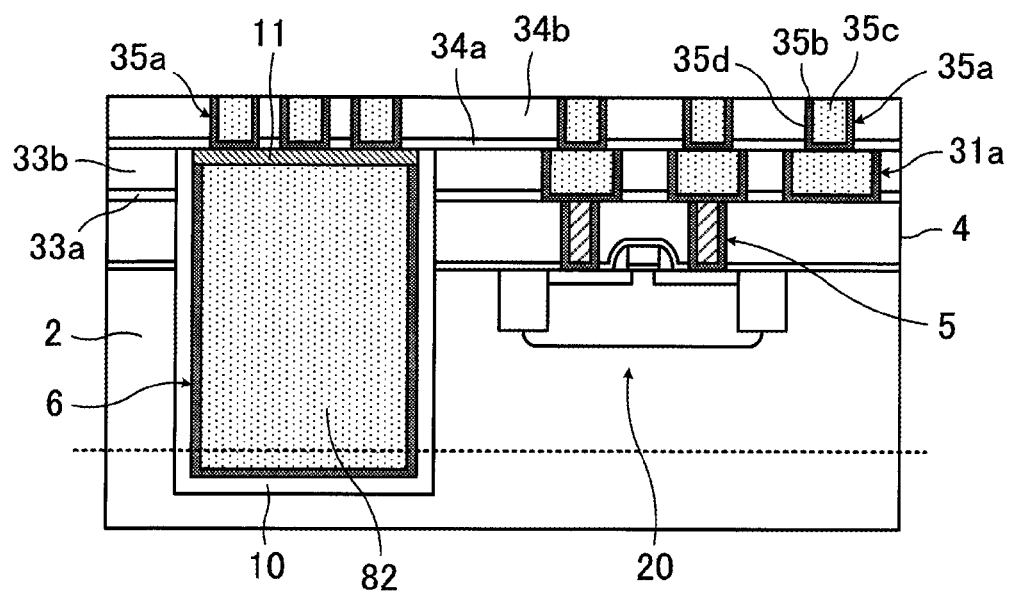

FIGS. 24A and 24B are views for describing an example of a wiring layer formation step in the fourth embodiment. FIG. 24A is a fragmentary schematic sectional view of a cap film and interlayer dielectric formation step. FIG. 24B is a fragmentary schematic sectional view of a conductive via formation step.

As illustrated in FIG. 24A, after the steps to the step of forming the metal cap film 11 are performed in the above way, first an insulating cap film 34*a* is formed and an interlayer dielectric 34*b* is formed over it.

After the formation of the cap film 34*a* and the interlayer dielectric 34*b*, as illustrated in FIG. 24B, a plurality of conductive vias 35*a* are formed. Each conductive via 35*a* includes a barrier metal film (barrier film) 35*b* and a conductive layer 35*c* formed with the barrier metal film 35*b* between. The barrier metal film 35*b* carries out the function of preventing an element from diffusing from the conductive layer 35*c*. For example, some of the plurality of conductive vias 35*a* are formed so that they will pierce the cap film 34*a* and the interlayer dielectric 34*b* and so that they will reach wirings 31*a*. The others are formed so that they will pierce the cap film 34*a* and the interlayer dielectric 34*b* and so that they will reach the conductive via 6.

The plurality of conductive vias 35*a* can be formed in block by the single damascene process. That is to say, via holes 35*d* which pierce the cap film 34*a* and the interlayer dielectric 34*b* are formed first at determined positions by photolithography and etching. The barrier metal film 35*b* and the conductive layer 35*c* are then formed in the via holes 35*d* and over the interlayer dielectric 34*b*. The barrier metal film 35*b* and the conductive layer 35*c* formed over the interlayer dielectric 34*b* are removed by the CMP. As a result, the conductive layer 35*c* is formed in the via holes 35*d* with the barrier metal film 35*b* between and the conductive vias 35*a* are formed in the via holes 35*d*.

Figure 25:
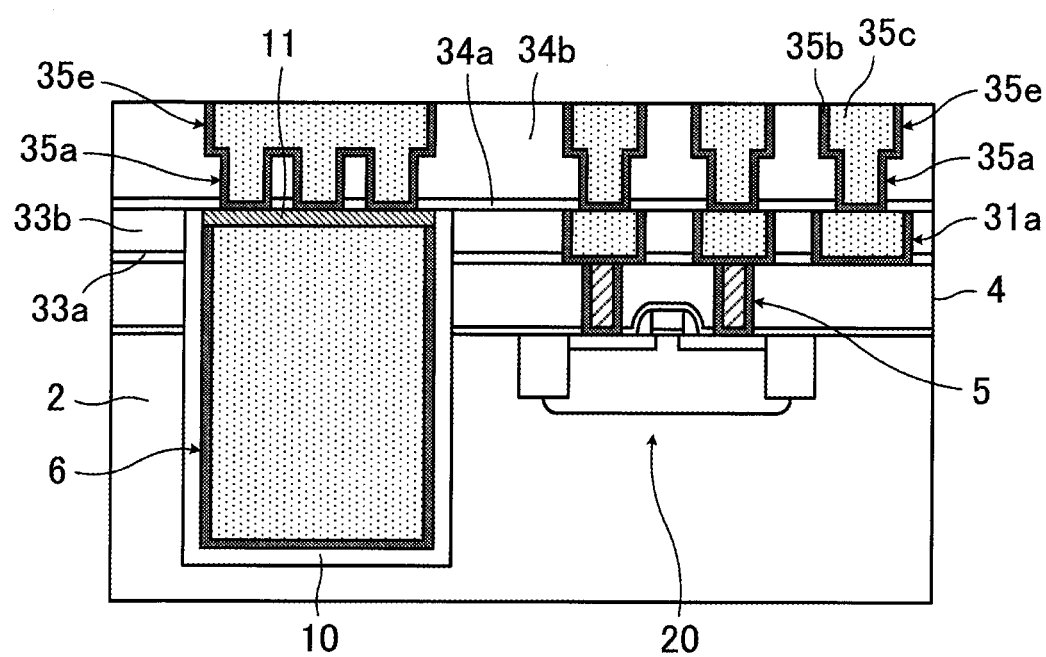
FIG. 25 is a view for describing another example of a wiring layer formation step in the fourth embodiment.

The case where the conductive vias 35*a* included in the second wiring layer are formed by the single damascene process is taken as an example. However, as illustrated in FIG. 25, both conductive vias 35*a* and wirings 35*e* may be formed by the dual damascene process.

The second wiring layer of the multilayer interconnection 30 is formed in this way. The third and later wiring layers are formed in the same way and the multilayer interconnection 30 including a determined number of wiring layers is formed. After that, as illustrated in FIGS. 18C through 18E, the pad 41 and the cover film 42 are formed, back grind of the semiconductor substrate 2 is performed so that the conductive via 6 will get exposed, and the bump 62 and the like are formed. After that, dicing is performed and individual semiconductor devices 1*a* are completed.

When the conductive via 6 formed in the above way gets exposed as a result of back grind, it is desirable from the viewpoint of the formation of a low-resistance TSV that a portion of the conductive layer 82 in the conductive via 6 made of Cu or made mainly of Cu get exposed on a back of the semiconductor substrate 2. That is to say, it is desirable to perform back grind to a position indicated by a dotted line in FIG. 24C for convenience.

With the method according to the fourth embodiment for fabricating the semiconductor device 1*a*, as has been described in the foregoing, both the wiring grooves 31*d* and the via hole 6*a* are filled in with the barrier metal film 81 and the conductive layer 82 and the wirings 31*a* of the first wiring layer and the conductive via 6 for a TSV are formed at the same time by polishing. After that, the second and later wiring layers of the multilayer interconnection 30 are formed.

With the method according to the fourth embodiment the wirings 31*a* of the first wiring layer and the conductive via 6 for a TSV can be formed by the use of the same material. For example, by forming both the wirings 31*a* and the conductive via 6 by the use of a low-resistance material such as Cu, the resistance of the wirings 31*a* and the conductive via 6 can be reduced.

Furthermore, in the fourth embodiment the conductive via 6 for a TSV and the wirings 31*a* of the first wiring layer of the multilayer interconnection 30 are formed at the same time and then the second and later wiring layers are formed. Accordingly, the semiconductor device 1*a* including a TSV can be fabricated without complicating its fabrication process, compared with, for example, a case where a conductive via is formed after the formation of a multilayer interconnection. In addition, the formation of the conductive via 6 is completed before the formation of the first wiring layer, so the second and later wiring layers can smoothly be formed with accuracy. As a result, the multilayer interconnection 30 in which conductive vias and wirings are arranged at desired positions can be obtained.

Figure 26:
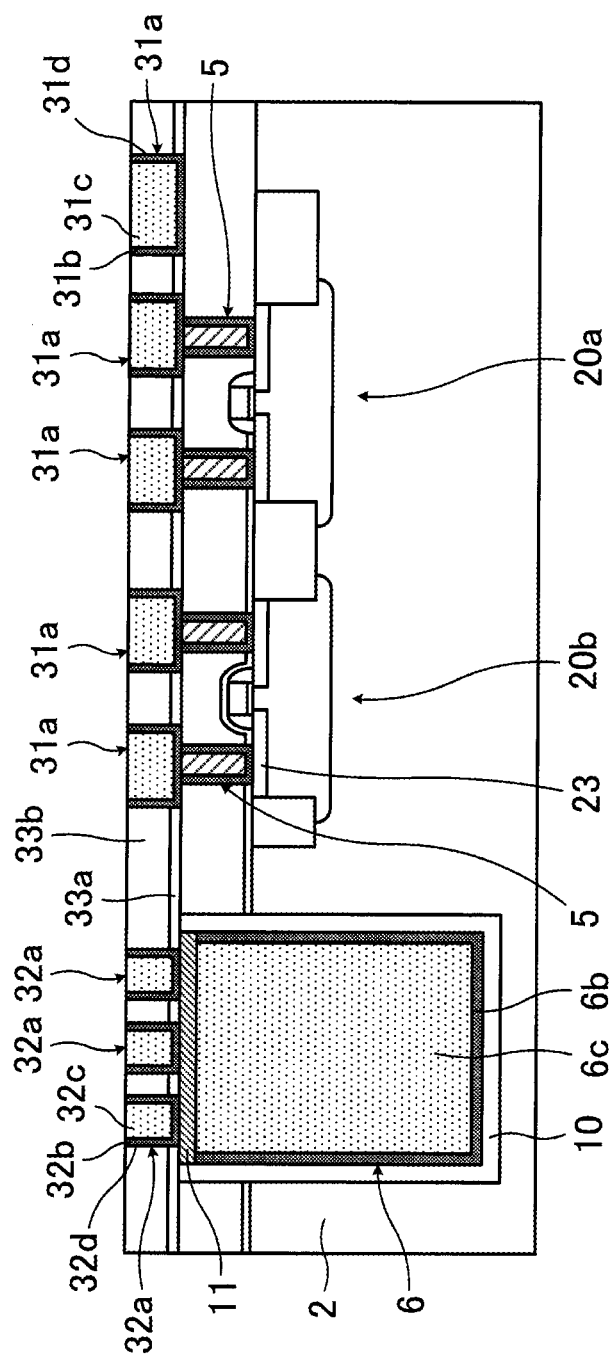
FIG. 26 is a view for describing an example of a semiconductor device.

In the above description the transistor 20 is a MOS transistor. However, a MOS transistor may be a p-channel MOS transistor or an n-channel MOS transistor. Of course, as illustrated in FIG. 26, both a p-channel MOS transistor (pMOS) 20*a* and an n-channel MOS transistor (nMOS) 20*b* may be formed in a same semiconductor substrate 2. FIG. 26 illustrates an example of a structure obtained in the case of using the method described in the above first embodiment. The structure illustrated in FIG. 26 can be obtained by using the semiconductor substrate 2 in which the pMOS 20*a* and the nMOS 20*b* are formed and forming conductive vias 5 and 6, a metal cap film 11, and wirings 31*a* and 32*a* in accordance with the examples of FIGS. 3A, 3B, and 3C through FIGS. 7A and 7B described in the above first embodiment. If the method described in the above second, third, or fourth embodiment is used, a semiconductor substrate 2 in which a pMOS 20a and an nMOS 20b are formed is used and conductive vias 5 and 6 and the like can be formed in the same way.

Furthermore, in the above description a case where the multilayer interconnection 30 is formed in the semiconductor device 1 or 1a is taken as an example. However, the number of wiring layers included in the multilayer interconnection 30 is not limited to the number indicated in the above examples. In addition, the multilayer interconnection 30 may include a single wiring layer.

According to the disclosed methods, a desired semiconductor device in which conductive vias are formed in a semiconductor substrate can be fabricated without complicating its fabrication process. In addition, a high-quality semiconductor device including such conductive vias can be fabricated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device fabrication method comprising:
    forming a transistor with a source and a drain on a semiconductor substrate;
    forming a first insulating film over the transistor;
    forming, in the first insulating film, a first conductive via which reaches the source or the drain;
    forming an opening which pierces the first insulating film and which reaches an inside of the semiconductor substrate;
    forming a second insulating film on a sidewall of the opening;
    forming a conductive layer over the first insulating film and in the opening;
    removing the conductive layer over the first insulating film by polishing to form a second conductive via in the opening;
    forming a third insulating film over the first insulating film and the second conductive via;
    forming, in the third insulating film, a first wiring which reaches the first conductive via and a second wiring which reaches the second conductive via;
    forming, after the forming the first conductive via and before the forming the opening, a fourth insulating film over the first insulating film and the first conductive via, wherein:
    in the forming the opening, the opening which pierces the first insulating film and the fourth insulating film and which reaches the inside of the semiconductor substrate is formed; and
    in the forming the second conductive via, the conductive layer is removed by the polishing with the fourth insulating film as a stopper and the fourth insulating film is removed after the polishing.

2. The semiconductor device fabrication method according to claim 1, further comprising forming, after the forming the second insulating film and before the forming the conductive layer, a barrier film over the first insulating film and the second insulating film formed on the sidewall of the opening,
    wherein in the forming the second conductive via, the conductive layer and the barrier film over the first insulating film are removed by the polishing and the second conductive via is formed in the opening.

3. The semiconductor device fabrication method according to claim 1, further comprising forming, after the forming the second conductive via, a metal cap film over the second conductive via.

4. The semiconductor device fabrication method according to claim 3, wherein:
    in the removing the conductive layer over the first insulating film by polishing, the conductive layer is removed by the polishing so that an upper side of the second conductive via formed in the opening becomes lower than an upper end of the opening; and
    in the forming the metal cap film, the metal cap film is formed over the second conductive via whose upper side is lower than the upper end of the opening.

5. The semiconductor device fabrication method according to claim 1, further comprising grinding the semiconductor substrate from a side opposite to a side in which the transistor is formed so as to make the second conductive via get exposed on the side opposite to the side in which the transistor is formed.

6. A semiconductor device fabrication method comprising:
    forming a transistor with a source and a drain on a semiconductor substrate;
    forming a first insulating film over the transistor;
    forming, in the first insulating film, a via hole which reaches the source or the drain;
    forming a filler material in the via hole;
    forming an opening which pierces the first insulating film and which reaches an inside of the semiconductor substrate;
    forming a second insulating film on a sidewall of the opening;
    removing the filler material after the forming the second insulating film;
    forming a conductive layer over the first insulating film, in the opening, and in the via hole;
    removing the conductive layer over the first insulating film by polishing, forming a first conductive via in the via hole, and forming a second conductive via in the opening;
    forming a third insulating film over the first insulating film, the first conductive via, and the second conductive via; and
    forming, in the third insulating film, a first wiring which reaches the first conductive via and a second wiring which reaches the second conductive via.

7. The semiconductor device fabrication method according to claim 6, further comprising forming, after the removing the filler material and before the forming the conductive layer, a barrier film over the first insulating film, the second insulating film formed on the sidewall of the opening, and an inside of the via hole,
    wherein in the forming the first conductive via and the second conductive via, the conductive layer and the barrier film over the first insulating film are removed by the polishing, the first conductive via is formed in the via hole, and the second conductive via is formed in the opening.

8. The semiconductor device fabrication method according to claim 6, wherein:

the conductive layer includes a first conductive layer and a second conductive layer; and the forming the conductive layer includes:

forming the first conductive layer over the first insulating film, over the second insulating film formed on the sidewall of the opening, and in the via hole and filling in the via hole with the first conductive layer; and forming the second conductive layer over the first conductive layer and in the opening and filling in the opening with the second conductive layer.

9. The semiconductor device fabrication method according to claim 8, further comprising:

forming, before the forming the first conductive layer, a first barrier film over the first insulating film, the second insulating film formed on the sidewall of the opening, and an inside of the via hole; and forming, before the forming the second conductive layer, a second barrier film over the first conductive layer, wherein in the forming the first conductive via and the second conductive via, the second conductive layer, the second barrier film, the first conductive layer, and the first barrier film over the first insulating film are removed by the polishing, the first conductive via is formed in the via hole, and the second conductive via is formed in the opening.

10. The semiconductor device fabrication method according to claim 6, wherein in the forming the second insulating film, the second insulating film is formed on the sidewall of the opening, over the first insulating film, and over the filler material, the method further includes selectively removing, before the removing the filler material, the first insulating film and the second insulating film over the filler material.

11. The semiconductor device fabrication method according to claim 6, further comprising forming, after the forming the second conductive via, a metal cap film over the second conductive via.

12. The semiconductor device fabrication method according to claim 11, wherein:

in the removing the conductive layer over the first insulating film by polishing, the conductive layer is removed by the polishing so that an upper side of the second conductive via formed in the opening becomes lower than an upper end of the opening; and in the forming the metal cap film, the metal cap film is formed over the second conductive via whose upper side is lower than the upper end of the opening.

13. The semiconductor device fabrication method according to claim 6, further comprising grinding the semiconductor substrate from a side opposite to a side in which the transistor is formed so as to make the second conductive via get exposed on the side opposite to the side in which the transistor is formed.

14. A semiconductor device fabrication method comprising:

forming a transistor with a source and a drain on a semiconductor substrate;

forming a first insulating film over the transistor;

forming, in the first insulating film, a first conductive via which reaches the source or the drain;

forming a second insulating film over the first insulating film and the first conductive via;

forming, in the second insulating film, a wiring groove which reaches the first conductive via;

forming a filler material in the wiring groove;

forming an opening which pierces the first insulating film and the second insulating film and which reaches an inside of the semiconductor substrate;

forming a third insulating film on a sidewall of the opening;

removing the filler material after the forming the third insulating film;

forming a conductive layer over the second insulating film, in the wiring groove, and in the opening;

removing the conductive layer over the second insulating film by polishing, forming a wiring in the wiring groove, and forming a second conductive via in the opening;

forming a fourth insulating film over the second insulating film, the wiring, and the second conductive via; and forming, in the fourth insulating film, a third conductive via which reaches the wiring and a fourth conductive via which reaches the second conductive via.

15. The semiconductor device fabrication method according to claim 14, further comprising forming, after the removing the filler material and before the forming the conductive layer, a barrier film over the second insulating film, in the wiring groove, and over the third insulating film formed on the sidewall of the opening, wherein in the forming the second conductive via, the conductive layer and the barrier film over the second insulating film are removed by the polishing and the second conductive via is formed in the opening.

16. The semiconductor device fabrication method according to claim 14, wherein in the forming the third insulating film, the third insulating film is formed on the sidewall of the opening, over the second insulating film, and over the filler material, the method further includes selectively removing, before the removing the filler material, the third insulating film over the second insulating film and the filler material.

17. The semiconductor device fabrication method according to claim 14, further comprising forming, after the forming the second conductive via, a metal cap film over the second conductive via.

18. The semiconductor device fabrication method according to claim 17, wherein:

in the removing the conductive layer over the first insulating film by polishing, the conductive layer is removed by the polishing so that an upper side of the second conductive via formed in the opening becomes lower than an upper end of the opening; and in the forming the metal cap film, the metal cap film is formed over the second conductive via whose upper side is lower than the upper end of the opening.

19. The semiconductor device fabrication method according to claim 14, further comprising grinding the semiconductor substrate from a side opposite to a side in which the transistor is formed so as to make the second conductive via get exposed on the side opposite to the side in which the transistor is formed.

* * * * *